United States Patent [19]

Ishihara et al.

[11] Patent Number: 4,716,048

[45] Date of Patent: Dec. 29, 1987

[54] PROCESS FOR FORMING DEPOSITED FILM

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[21] Appl. No.: 828,256

[22] Filed: Feb. 11, 1986

[30] Foreign Application Priority Data

| Feb. 12, 1985 | [JP] | Japan | 60-025896 |
| Feb. 18, 1985 | [JP] | Japan | 60-029809 |
| Feb. 19, 1985 | [JP] | Japan | 60-031053 |
| Feb. 20, 1985 | [JP] | Japan | 60-031871 |
| Feb. 21, 1985 | [JP] | Japan | 60-033276 |
| Feb. 22, 1985 | [JP] | Japan | 60-034778 |

[51] Int. Cl.⁴ .................................. H01L 21/469
[52] U.S. Cl. .................................. 427/39; 427/53.1; 437/233
[58] Field of Search ............... 427/38, 39, 53.1, 86, 427/87; 204/157.15, 157.3, 157.4; 118/719

[56] References Cited

U.S. PATENT DOCUMENTS

| 3,825,439 | 7/1974 | Tick | 427/87 |
| 3,916,034 | 10/1975 | Tsuchimoto | 427/85 |
| 4,220,488 | 9/1980 | Duchemin et al. | 118/719 |
| 4,434,188 | 2/1984 | Kamo et al. | 427/113 |
| 4,461,783 | 7/1984 | Yamazaki | 427/86 |
| 4,521,447 | 6/1985 | Ovshinsky et al. | 427/38 |
| 4,522,663 | 6/1985 | Ovshinsky et al. | 427/86 |
| 4,569,697 | 2/1986 | Tsu et al. | 427/86 |
| 4,582,560 | 4/1986 | Sanjurjo | 427/86 |

FOREIGN PATENT DOCUMENTS

| 0090586 | 10/1983 | European Pat. Off. | 427/39 |
| 59-199035 | 11/1984 | Japan | 427/39 |

Primary Examiner—John H. Newsome
Attorney, Agent, or Firm—Fitzpatrick, Cella, Harper & Scinto

[57] ABSTRACT

A process for forming a deposited film comprises introducing into a film forming space housing a substrate therein an active species (A) formed by decomposition of a compound containing germanium and a halogen and an active species (B) formed from a chemical substance for film formation which is reactive with said active species (A) separately form each other, and then allowing both the species to react with each other thereby to form a deposited film on the substrate.

21 Claims, 4 Drawing Figures

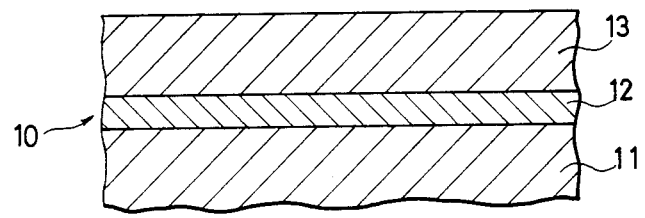
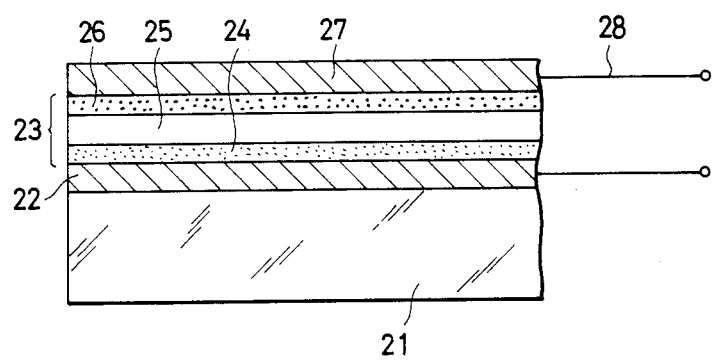

PROCESS FOR FORMING DEPOSITED FILM

BACKGROUND OF THE INVENTION

1. Field of the Invention

This invention relates to a process suitable for forming a deposited film, in particular a functional film, above all an amorphous or crystalline deposited film to be used tor semiconductor devices, photosensitive devices for electrophotography, line sensors for image input, image pick-up devices, photovoltaic devices,etc.

2. Description of the Prior Art

For example, for formation of an amorphous silicon film, an amorphous germanium film, etc. the vacuum deposition method, the plasma CVD method, the CVD method, the reactive sputtering method, the ion plating method, the optical CVD method or the like have been attempted to be utilized, and, in general, the plasma CVD method has widely been used and industrialized.

However, for the deposited film composed of amorphous silicon, amorphous germanium, etc. there is room for further improvement of its overall characteristics, that is, electrical or optical characteristic, fatigue characteristic during repeated use in various kinds of, characteristic for use environment, improved productivity, mass productivity including uniformity, reproducibility and the like.

The reaction process in formation of an amorphous silicon deposited film, an amorphous germanium deposited film, etc. according to the plasma CVD method generalized in the prior art is considerably complicated as compared with the conventional CVD method and more than a few ambiguities existed in its reaction mechanism. Also, there are a large number of parameters involved for formation of such a deposited film (e.g. substrate temperature, flow rates and ratios of gases introduced, pressure during film formation, high frequency power, electrode structure, structure of reaction vessel, gas discharging speed, plasma generation system, etc.). The nature of the formed plasma depends on such numerous parameters and sometimes becomes unstable. This often gives markedly bad properties to the deposited film formed. Besides, the parameters associated with an apparatus must be determined for each apparatus, and it has been difficult under the present situation to standardize the production conditions. On the other hand, for forming an amorphous silicon film, an amorphous germanium film, etc. having satisfactory electrical, optical,photoconductive or mechanical characteristics for respective uses. it has been deemed best to form such a film according to the plasma CVD method under the present situation.

However, in some applied uses of the deposited film, it is required to sufficiently accomplish enlargement of film area, uniformization of film thickness and film quality, etc. and also to perform a mass production with reproducibility by high speed film formation. Thus, in formation of amorphous silicon deposited film, amorphous germanium deposited films, etc. according to the plasma CVD method, enormous investment for mass production equipment is necessary, and operating conditions for mass production are complicated. Accordingly the tolerances narrower and for mass production that makes the regulation of apparatuses delicate. These problems have been pointed out for improvement in the future. On the other hand, in the prior art using the conventional CVD method,high temperature is required and no deposited film having practical characteristics could be obtained.

As described above, in formation of amorphous silicon films, amorphous germanium films, etc., it has earnestly been desired to develop a formation process which can perform mass production by means of a low cost apparatus while maintaining practical characteristics and uniformity. These discussions may also be applicable to other functional films such as silicon nitride films, silicon carbide films, silicon oxide films, etc.

SUMMARY OF THE INVENTION

The present invention provides a novel process for formation of a deposited film which removes the drawbacks of the plasma CVD method as described above and does not use conventional film forming methods of the prior art.

An object of the present invention is to provide a process for forming a deposited film which is suitable for enlargement of the film and can easily accomplish improvement of productivity and mass production of the film, while attempting to improve the characteristics of the film formed, the film forming speed and reproducibility and also to uniformize film quality.

According to the present invention, there is provided a process for forming a deposited film, which comprises introducing into a film forming space housing a substrate therein an active species (A) formed by decomposition of a compound containing germanium and a halogen and an active species (B) formed from a chemical substance for film formation which is reactive with said active species (A) separately from each other, and then allowing both the species to react with each other thereby to form a deposited film on the substrate.

BRIEF DESCRIPTION OF THE DRAWINGS

FIG. 1 is a schematic sectional view for illustration of a construction example of the image forming member for electrophotography produced by use of the process of the present invention;

FIG. 2 is a schematic sectional view for illustration of a construction example of a PIN type diode produced by use of the process of the present invention.

DESCRIPTION OF THE PREFERRED EMBODIMENTS

Figure 3:
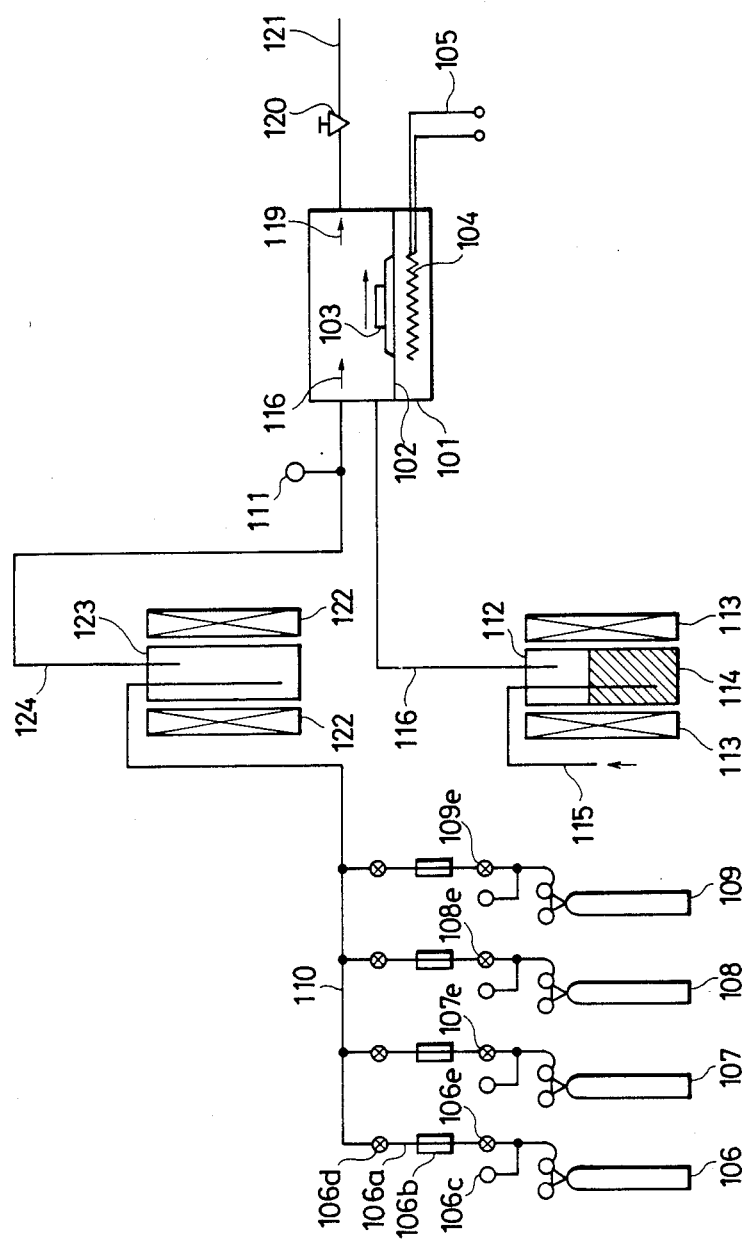
FIG. 3 and FIG. 4 are schematic diagrams for illustration of the constitutions of the devices for practicing the process of the present invention employed in respective examples.

In the process of the present invention, since no plasma is excited in the film forming space for formation of a deposited film, the deposited film formed is free from bad influence by etching action or other actions such as abnormal discharging action, contamination with impurities from the inner wall surface of the film forming chamber, etc.

Also, according to the present invention, by controlling the atmosphere temperature in the film forming space and the substrate temparature as desired, the CVD process can be made more stable.

One of the points in which the process of the present invention is different from the CVD process of the prior art is to use active species obtained by being previously activated in a space different from the film forming space (hereinafter referred to as activation space). By doing so, the film forming speed can be dramatically increased as compared with the CVD method of the prior art. In addition, the substrate temperature during film formation can be lowered to a great extent, whereby deposited films with stable film quality can be provided commercially in a large amount and yet at low cost.

The term active species (A) as herein mentioned refers to those having the action of promoting formation of deposited films by causing chemical mutual actions with the active species (B) formed from a chemical substance for film formation, thereby imparting energy or causing chemical reactions to occur. Thus, the active species (A) may either contain the constituent elements which become the constituent elements constituting the deposited film to be formed or contain no such constituent element.

In the present invention, the active species (A) from the activation space (A) should preferably be selected for use, as desired, from those having a life of 0.1 sec. or longer, more preferably 1 sec. or longer, optimally 10 sec. or longer, from the standpoint of productivity and easiness in handling.

In the present invention, as the compound containing germanium and a halogen to be introduced into the activation space (A), there may be employed, for example, chain or cyclic hydrogenated germaniums of which hydrogen atoms are partially or wholly substituted with halogen atoms, typically chain germanium halides represented by $Ge_uY_{2u+2}$ (u is an integer of 1 or more, and Y is at least one element selected from F, Cl, Br and I); cyclic carbon halides represented by $Ge_vY_{2v}$ (v is an integer of 3 or more, and Y has the same meaning as defined above), and chain or cyclic compounds represented by $Ge_uH_xY_y$ (u and Y have the same meanings as defined above, $x+Y=2u$ or $2u+2$).

Specific examples may include gaseous or readily gasifiable compounds such as $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2Cl_3F_3$ and the like.

Also, in the present invention, in addition to the active species (A) formed by decomposition of the compound containing germanium and a halogen, it is also possible to use an active species (SX) formed by decomposition of a compound containing silicon and a halogen and/or an acitve species (CX) formed by decomposition of a compound containing carbon and a halogen in combination.

As the compound containing silicon and a halogen, there may be employed, for example, chain or cyclic hydrogenated silicon of which hydrogen atoms are partially or wholly substitued with halogen atoms, typically chain silicon halides represented by $Si_uZ_{2u+2}$ (u is an integer of 1 or more, Z is at least one element selected from F, Cl, Br and I), cyclic silicon halides represented by $Si_vZ_{2v}$ (v is an integer of 3 or more, and Z has the same meaning as defined above), and chain or cyclic compounds represented by $Si_uH_xZ_y$ (u and Z have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$. $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and the like.

These compounds containing silicon and a halogen may be used alone or as a combination of two or more compounds.

As the compound containing carbon and a halogen to be introduced into the activation space (A), there may be emoloyed, for example, chain or cyclic hydrocarbons of which hydrogen atoms are partially or wholly substituted with halogen atoms, typically chain carbon halides represented by $C_uY_{2u+2}$ (u is an integer of 1 or more, Y is at least one element selected from F, Cl, Br and I) cyclic carbon halides represented by $C_vY_{2v}$ (v is an integer of 3 or more, and Y has the same meaning as defined above), and chain or cyclic compounds represented by $C_uH_xY_y$ (u and Y have the same meanings as defined above, $x+y=2u$ or $2u+2$).

Specific examples may include gaseous or readily gasifiable compounds such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CHBr_3$, $CHI_3$, $C_2Cl_3F_3$, and the like.

These compounds containing carbon and a halogen may be used alone or as a combination of two or more compounds.

For formation of the active species (A), in addition to the above compound containing germanium and a halogen (and the compound containing carbon and a halogen or the compound containing silicon and a halogen), other germanium compounds such as single substance of germanium, etc., hydrogen or halogen compounds (e.g., $F_2$ gas, $Cl_2$ gas, gasified $Br_2$, $I_2$, etc.) may be used in combination.

As the chemical substance for film formation for forming the active species (B) used in the present invention, there may be included those containing the constituent elements which become the constituent elements constituting the deposited film to be formed and functioning as a starting material for formation of the deposited film or those not containing the constituent elements which become the constituent elements constituting the deposited film to be formed and capable of being considered to merely contribute to film formation. The compounds functioning as a starting material for formation of the deposited film and the compounds contributing to film formation may be used in combination.

The chemical substance for film formation to be used in the present invention may preferably be already gaseous or made gasoous before introduction into activation space (B). For example, when a liquid compound is used, a suitable gasfying device can be connected to the source for supplying the compound, and the compound can be gasified before introduction into the activation space (B).

In the activation space (B) to be used in the process of the present invention, as the above chemical substance for film formation for forming active species (B), hydrogen gas and/or halogen compounds (e.g. $F_2$ gas, $Cl_2$ gas, gasified $Br_2$, $I_2$, etc.) may be advantageously employed. Also, in addition to these chemical substances for film formation, inert gases such as helium, argon, neon, etc. may be used. When a plurality of these chemical substances for film formation are to be employed, they can be previously mixed before introduction into the activation space (B), or alternatively these chemical substances can individually be supplied from feeding sources independent of each other to be introduced into the activation space (B), or into independent respective activation spaces to be individually activated therein.

In the activation space (B) to be used in the process of the present invention, as the above chemical substance for film formation for forming active species (B), there may also be advantageously employed silicon containing compounds, carbon containing compounds, germanium containing compounds, oxygen containing compounds and nitrogen containing compounds.

As the silicon containing compound, there may be employed unsubstituted or substituted silanes having hydrogen, halogen and hydrocarbon groups bonded to silicon. Above all, chain or cyclic silane compounds and those chain and cyclic silane compounds of which hydrogen atoms are substituted partially or wholly with halogen atoms are preferred.

Specifically, there may be included, for example, straight chain silane compounds represented by $Si_pH_{2p+2}$ (p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc. which may be substituted with halogen; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc. which may be substituted with halogen; and cyclic silane compounds represented by $Si_qH_{2q}$ is an integer of 3 or more, preferably 3 to 6) such as $Si_3H_6$, $Si_4H_8$, $Si_5H_{10}$, $Si_6H_{12}$, etc. which may be substituted with other cyclic silanyl groups and/or chain silanyl groups. Examples of the above silane compounds in which a part or all of the hydrogen atoms are substituted with halogen atoms may include halo-substituted chain or cyclic silane compounds represented by $Si_rH_sX_t$ (X is a halogen atom, r is an integer of 1 or more, preferably 1 to 10, more preferably 3 to 7, s+t=2r+2 or 2r) such as $SiH_3F$, $SiH_3Cl$, $SiH_3Br$, $SiH_3I$, etc. These compounds may be used either alone or as a combination of two or more compounds.

In the above case, in addition to the silicon containing compounds for film formation, it is possible to introduce one or more kinds of the aforesaid hydrogen gas, halogen compounds (e.g. $F_2$ gas, $Cl_2$ gas, gasified $Br_2$, $I_2$, etc.) and inert gases such as helium, argon, neon, etc. into the activation space (B). When a plurality of these chemical substances for film formation are to be employed, they can be previously mixed before introduction into the activation space (B), or alternatively these starting gases can individually be supplied from feeding sources independent of each other to be introduced into the activation space (B), or into independent respective activation spaces to be individually activated therein.

As the carbon containing compound, there may be employed preferably gaseous or readily gasifiable compounds selected from chain or cyclic saturated or unsaturated hydrocarbon compounds, organic compounds containing carbon and hydrogen as main constituent atoms and additionally containing at least one of halogen, sulfur, etc. as constituent atoms, and organic silicon compounds containing hydrocarbon groups as constituent components or having silicon-carbon bonds.

Among them, as hydrocarbon compounds, there may be enumerated saturated hydrocarbons having 1 to 5 carbon atoms, ethylenic hydrocarbons having 2 to 5 carbon atoms, acetylenic hydrocarbons having 2 to 4 carbon atoms, including specifically, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$). etc.

As halo-substituted hydrocarbon compounds, there may be enumerated compounds in which at least one of hydrogen atoms which are constituents of the above hydrocarbon compounds are substituted with F, Cl, Br or I, particularly those in which hydrogen is substituted with F or Cl, as effective ones.

The halogens substituted for hydrogen may be either one kind or two or more kinds in one compound As organic silicon compounds to be used in the present inventionmay include organosilanes and organohalogenosilanes.

Organosilanes and organohalogenosilanes are compounds represented, respectively, by the general formulae:

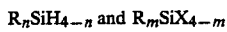

$R_nSiH_{4-n}$ and $R_mSiX_{4-m}$ wherein R is alkyl or aryl; X is F, Cl, Br or I: n=1,2,3 or 4; and m=1,2 or 3, including typically alkylsilanes, arylsilanes, alkylhalogenosilanes, and arylhalogenosilanes.

Specific example of organochlorosilanes include

| | |
|---|---|
| trichloromethylsilane | $CH_3SiCl_3$, |
| dichlorodimethylsilane | $(CH_3)_2SiCl_2$, |
| chlorotrimethylsilane | $(CH_3)_3SiCl$, |
| trichloroethylsilane | $C_2H_5SiCl_3$ and |
| dichlorodiethylsilane | $(C_2H_5)_2SiCl_2$. |

Specific examples of organochlorofluorosilanes include

| | |
|---|---|
| chlorodifluoromethylsilane | $CH_3SiF_2Cl$, |
| dichlorofuloromethylsilane | $CH_3SiFCl_2$, |
| chlorofulorodimethylsilane | $(CH_3)_2SiFCl$, |
| chloroethyldifluorosilane | $(C_5H_5)SiF_2Cl$, |
| dichloroethylfluorosilane | $C_2H_5SiFCl_2$, |
| chlorodifluoropropylsilane | $C_3H_7SiF_2Cl$ and |
| dichlorofluoropropylsilane | $C_3H_7SiFCl_2$. |

Specific examples of organosilanes include

| | |
|---|---|
| tetramethylsilane | $(CH_3)_4Si$, |
| ethyltrimethylsilane | $(CH_3)_3SiC_2H_5$, |
| trimethylpropylsilane | $(CH_3)_3SiC_3H_7$, |
| triethylmethylsilane | $CH_3Si(C_2H_5)_3$ and |
| tetraethylsilane | $(C_2H_5)_4Si$. |

Specific examples of organohydrogenosilanes include

| | |
|---|---|
| methylsilane | $CH_3SiH_3$, |
| dimethylsilane | $(CH_3)_2SiH_2$, |
| trimethylsilane | $(CH_3)_3SiH$, |
| diethylsilane | $(C_2H_5)_2SiH_2$, |
| triethylsilane | $(C_2H_5)_3SiH$, |
| tripropylsilane | $(C_3H_7)_3SiH$ and |
| diphenylsilane | $(C_6H_5)_2SiH_2$. |

Specific examples of organofluorosilanes include

| | |
|---|---|
| trifluoromethylsilane | $CH_3SiF_3$, |
| difluorodimethylsilane | $(CH_3)_2SiF_2$, |
| fluorotrimethylsilane | $(CH_3)_3SiF$, |
| ethyltrifluorosilane | $C_2H_5SiF_3$, |
| diethyldifluorosilane | $(C_2H_5)_2SiF_2$, |
| triethylfulorosilane | $(C_2H_5)_3SiF$ and |
| trifluoropropylsilane | $(C_3H_7)SiF_3$. |

Specific examples of organobromosilanes include

| | |
|---|---|
| bromotrimethylsilane | $(CH_3)_3SiBr$ and |
| dibromodimethylsilane | $(CH_3)_2SiBr_2$. |

In addition, it is also possible to use organopolysilanes, for example,

| organodisilanes such as | |
|---|---|
| hexamethyldisilane | $[(CH_3)_3Si]_2$ and |
| hexapropyldisilane | $[(C_3H_7)_3Si]_2$. |

These carbon containing compounds may be used either alone or as a combination of two or more compounds.

In the above case, in addition to the carbon containing compounds, one or more kinds of hydrogen, halogen compounds (e.g $F_2$ gas, $Cl_2$ gas, gasified $Br_2$, $I_2$, etc.), inert gases such as helium, neon, argon, etc. and the aforesaid silicon compounds may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the germanium containing compounds, there may be employed inorganic or organic germanium containing compounds having hydrogen, halogens or hydrocarbon groups bonded to germanium, as exemplified by organic germanium compounds such as chain or cyclic hydrogenated germanium represented by $Ge_aH_b$ (a is an integer of 1 or more, $b=2a+2$ or $2a$); polymers of the hydrogenated germanium; compounds in which a part or all of the hydrogen atoms in the above hydrogenated germanium are substituted with halogen atoms; compounds in which a part or all of the hydrogen atoms in the above hydrogenated germanium compounds are substituted with organic groups such as alkyl groups, aryl groups, etc. or, if desired, halogen atoms; etc. and inorganic germanium compounds such as sulfide, imides, etc.

Specifically, there may be enumerated, for example, $GeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6Ge_6F_6$, $Ge(CH_3)_4$, $Ge(C_2H_5)_4$, $CH_3GeH_3,(CH_3)_2GeH$, $(CH_3)_3GeH$, $(C_2H_5)_2GeH_2$, $Ge(C_6H_5)_4$, $Ge(CH_3)_2F_2$, $GeF_2$, $GeF_4$, $GeS$, $Ge_3N_4$, $Ge(NH_2)_2$, etc.

These germanium compounds may be used either alone or as a combination of two or more compounds.

In the above case, in addition to the germanium containing compounds, one or more kinds of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds or carbon containing may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the oxygen containing compound, there may be mentioned compounds containing oxygen atoms and at least one atom other than oxygen as constituent atoms. Other atoms than oxygen as mentioned above include hydrogen (H), halogens (X=F, Cl, Br or I), sulfur (S), carbon (C), silicon (Si), germanium (Ge), phosphorus (P), boron (B), alkali metals, alkaline earth metals, transition metals, etc. In addition, still other atoms, of elements belonging to the respective groups in the periodic table, which can be bonded to an oxygen atom may be available.

For example, as compounds containing O and H, there may be enumerated $H_2O$, $H_2O_2$, etc.; as compounds containing O and S, oxides such as $SO_2$, $SO_3$, etc.; as compounds containing O and C, oxides such as CO, $CO_2$, etc.; as compounds containing O and Si, siloxanes such as disiloxane ($H_3SiOSiH_3$), trisiloxane ($H_3SiOSiH_2OSiH_3$). etc., organoacetoxylilanes such as diacetoxydimethylsilane $(CH_3)_2Si(OCOCH_3)_2$, triacetoxymethylsilane $CH_3Si(OCOCH_3)_3$, etc., alkylalkoxysilanes such as methoxytrimethylsilane $(CH_3)_3SiOCH_3$, dimethoxydimethylsilane $(CH_3)_2Si(OCH_3)_2$, trimethoxymethylsilane $CH_3Si-(OCH_3)_3$), etc.; organosilanols such as trimethylsilanol $(CH_3)_3SiOH$, dimethylphenyl silanol $(CH_3)_2(C_6H_5)SiOH$, diethylsilanediol $(C_2H_5)_2Si(OH)_2$, etc.; as comounds containing O and Ge, oxides, hydroxides of Ge, germanic acids, organic germanium compounds such as $H_3GeOGeH_3$, $H_3GeOGeH_2OGeH_3$, etc., but the oxygen containing compounds to be used in the present invention are not limited to these compounds.

These oxygen containing compounds may be used either alone or as a combination of two or more compounds.

Also, it is possible to use gases other than these compounds such as $O_2$, $O_3$, etc.

In the above case, in addition to the oxygen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds or germanium containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

As the nitrogen containing compound, there may be included compounds containing nitrogen atoms and at least one atom other than nitrogen as constituent atoms. Other atoms than nitrogen as mentioned above include hydrogen (H), halogens (X=F, Cl, Br or I), sulfur (S), carbon (C), oxygen (O), phosphorus (P), silicon (Si), germanium (Ge), boron (B), alkali metals, alkaline earth metals, transition metals, etc. In addition, still other atoms, of elements belonging to the respective groups in the periodic table, which can be bonded to an nitrogen atom may be available.

For example, as compounds containing N and H, there may be enumerated $NH_3$, $NH_4N_3$, $N_2H_5N_3$, $H_2NNH_2$, primary to tertiary amines, halides of these amines, hydroxylamine, etc.; as compounds containing N and X, $N_3X$, $N_2X_2$, $NX_3$, $NOX$, $NO_2X$, $NO_3X_4$, etc.; as compounds containing N and S, $N_4S_4$, $N_2S_5$, etc.; as compounds containing N and C, $N(CH_3)_3$, HCN and cyanides, HOCN and salts thereof, etc.; as compounds containing N and O, $N_2O$, NO, $NO_2$, $N_2O_3$, $N_2O_4$, $N_2O_5$, $NO_3$, etc; as compounds containing N and P, $P_3N_5$, $P_2N_3$, PN, etc. In addition, there may also be employed organosilazanes such as triethylsilazane $(C_2H_5)_3SiNH_2$, hexamethyldisilazane $[(CH_3)_3Si]_2NH$, hexaethyldisilazane $[(C_2H_5)_3Si]_2NH$, etc.; organosilicon isocyanates such as trimethylsilicon isocyanate $(CH_3)_3SiNCO$, dimethylsilicon diisocyanate $(CH_3)_2Si(NCO)_2$, etc.; organosilicon isothiocyanates such as trimethylsilicon isothiocyanate $(CH_3)_3SiNCS$, etc. The nitrogen containing compound is not limited to these compounds provided that the compound is fit for attaining the object of the present invention.

These nitrogen containing compounds may be used either alone or as a combination of two or more compounds. Also, it is possible to use $N_2$ gas.

In the above case, in addition to the nitrogen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds, germanium containing compounds or oxygen containing compounds into the activation space (B). When a plurality of these chemical substances for film formation are to be employed, they can be previously mixed in a gaseous state before introduction into the activation space (B), or alternatively these chamical substances for film formation can individually be supplied from feeding sources independent of each other to be introduced into the activation space (B), or into independent respective activation spaces to be individually activated therein.

In the present invention, the proportion in amount of the active species (A) to the active spacies (B) in the film forming space may suitably be determined depending on the depositing conditions, the kind of activated species, etc., but may preferably be 10:1 to 1:10, more preferably 8:2 to 4:6.

In the present invention, as the method for forming activate species (A) and (B) in the activation spaces (A) and (B), respectively, there may be employed various activation energies such as electrical energies including microwave, RF, low frequency, DC, etc., heat energies including heater heating, IR-ray heating, etc., optical energies and the like in view of the respective conditions and the device.

On the other hand, the deposited film formed according to the present invention can be doped with impurity elements during or after film formation. As the impurity elements to be used, there may be employed, as p-type impurities, elements belonging to group III A of the periodic table such as B, Al, Ga, In, Tl, etc. and, as n-type imputities, elements belonging to group VA of the periodic table such as N, P, As, Sb, Bi, etc. as suitable ones. Particularly, B, Ga, P and Sb are most preferred. The doping amount of impurities may be determined suitably depending on the desired electrical and optical characteristics.

Among compounds containing such impurity atoms as the components, it is preferable to select a compound which is gaseous under normal temperature and normal pressure, or gaseous at least under the activating conditions, or a compound which can be readily gasified by a suitable gasifying device. Such compounds include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.. The compounds containing impurity atoms may be used either alone or as a combination of two or more compounds.

The substances for introduction of impurities may be introduced into the activation space (A) and/or the activation space (B) together with the respective substances for formation of the aotive species (A) or the active species (8) to be activated therein alternatively activated in a third activation space (C) separate from the activation space (A) and the activation space (B). The substance for introduction of impurity can be employed by selecting suitably the activation energy as described above. The active species formed by activation of the substance for introduction of impurity (PN) may be previously mixed with the active species (A) and/or the active species (B) before introduction into the film forming space or independently introduced into the film forming space.

Next, the present invention is described by referring to a typical example of the image forming member for electrophotography formed by the process of the present invention.

FIG. 1 is a schematic sectional view for illustration of the construction example of a typical photoconductive member obtained by the present invention.

Photoconductive member 10 shown in FIG. 1 is applicable as an image forming member for electrophotography, and has a layer constitution consisting of intermediate layer 12 which may optinally be provided and photosensitive layer 13 provided on substrate 11 as a photoconductive member.

In preparation of the photoconductive member 10, the intermediate layer 12 and /or the photosensitive member 13 can be prepared according to the process of the present invention. Further, when the photoconductive member 10 has an protective layer provided for the purpose of protecting chemically or physically the surface of the photosensitive layer 13, or a lower barrier layer and/or an upper barrier layer provided for improving dielectric strength, these layers can also be prepared according to the process of the present invention.

The substrate 11 may be either electroconductive or insulating. As electroconductive substrates, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins including polyesters, polyethylene, polycarbonates, cellulose acetate, polypropylene, polyvinyl chloride, polyvinylidene chloride, polystyrene, polyamides, etc.; glasses, ceramics, papers and so on. At least one side surface of these substrates is preferably subjected to treatment for imparting electroconductivity, and it is desirable to form other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$). etc. thereon. Alternatively, a synthetic resin film such as a polyester film can be subjected to the electroconducitve treatment on its surface by, for example, vacuum vapor deposition, electron-beam deposition or sputtering of a metral such as NiCr, Al, Ag, Pb, Zn, Ni, Au, Cr, Mo, Ir, Nb, Ta, V, Ti, Pt, etc. or by laminating treatment with the said metal, thereby imparting electroconductivity to the surface. The substrate may be shaped in any form such as cylinders, belts, plates or others, and its form may be determined as desired. For example, when the photoconductive member 10 in FIG. 1 is to be used as an image-forming member for electrophotography, it may desirably be formed into an endless belt or a cylinder for use in continuous high speed copying.

For example, the intermediate layer 12 has the function of impeding effectively inflow of the carriers from the side of the substrate 11 into the photosensitive layer 13 and permitting easy passage of the photocarriers, formed in the photosensitive layer 13 by irradiation of electromagnetic wave and migrating toward the side of the substrate 11, from the side of the photosensitive layer 13 to the side of the substrate 11.

The intermediate layer 12 is composed of, for example, amorphous germanium A—Ge(Si, H, X) containing germanium as a matrix and optionally silicon (Si), hydrogen (H), halogens (X) or the like as constituting atoms; amorphous germanium A—GeC(H, X, Si) containing germanium as a matrix and optionally silicon, hydrogen and/or halogens and further containing carbon (C) as constituting atoms; amorphous silicon-germanium A—SiGe (H, X) containing silicon and germanium as a matrix and optionally hydrogen and/or halogens; amorphous silicongermanium A—SiGe(H, X, O) containing silicon and germanium as a matrix and optionally hydrogen, halogens and/or oxygen (O) as constituting atoms; amorphous silicongermanium A—SiGeN(H,X) containing silicon and germanium as a matrix and optionally hydrogen and/or halogens and further containing nitrogen; or the like, and in addition may contain p-type impurities such as boron (B) and n-type impurities such as phosphorus (P).

In the present invention, the content of substances controlling conductivity such as B, P, etc. contained in the intermediate layer 12 may preferably be 0.001 to $5 \times 10^4$ atomic ppm, more preferably 0.5 to $1 \times 10^4$ atomic ppm, optimally 1 to $5 \times 10^3$ atomic ppm.

In the case of forming the intermediate layer 12, as starting materials for formation of the intermediate layer, active species (A) formed in activation space (A) and active species (B) formed in activation space (B), optionally together with active species formed by activation of hydrogen, halogens, inert gases, gases of silicon containing compounds, germanium containing compounds, carbon containing compounds, nitrogen containing compounds, compounds containing impurity elements as components, etc. may be introduced respectively and separately, or mixed together if desired, into the film forming space, in which the substrate 11 is placed, and the intermediate layer 12 may be formed on the substrate 11 by causing a chemical reaction.

The compound containing germanium and a halogen capable of forming active species (A) by introduction into the activation space (A) during formation of the intermediate layer 12 should desirably be selected from the aforesaid compounds, particularly those readily forming active species such as $GeF_2^*$. Similarly, as the compound containing silicon and halogen, it is desirable to select a compound from the compounds as mentioned above which can form readily active species such as $SiF_2^*$. Also, as the compound containing carbon and halogen, it is desirable to select a compound from the compounds as mentioned above which can form readily active species such as $CF_2^*$.

The intermediate layer 12 should have a layer thickness preferably 30 Å to 10μ, more preferably 40 Å to 8μ, optimally 50 Å to 5μ.

The photosensitive layer 13 is constituted of, for example, an amorphous material having a matrix of silicon atoms and optionally containing hydrogen atoms and/or halogen atoms (X) as constituent atoms (hereinafter referred to as "A—Si(H,X)"); an amorphous material having a matrix of silicon atoms and carbon atoms and optionally containing hydrogen atoms (H) and/or halogen atoms (X) (hereinafter referred to as "A—SiC(H,X); an amorphous material having a matrix of silicon atoms and optionally containing hydrogen, halogen germanium, carbon, etc. as constituent atoms (hereinafter referred to as A—Si(H, X, Ge, C); and amorphous material having a matrix of silicon atoms and germanium atoms optionally containing hydrogen, halogen, carbon, etc. (A—SiGe(H,X,C)) and the like, and has both functions of the charge generation function of generating photocarriers by irradiation of laser beam and the function of transporting the charges.

The photosensitive layer 13 should have a layer thickness preferably of 1 to 100μ, more preferably 1 to 80μ, optimally 2 to 50μ.

The photosensitive layer 13 is, for example, constituted of non-doped, Asi(H,X,Ge,C), Asi(H,X,Ge,C), A—Si(H,X,C), etc, but it may also contain a substance for controlling conductivity characteristic with a polarity different from the polarity of the substance for controlling conductivity characteristic contained in the intermediate layer 12 (e.g. n-type), if desired, or a substance of the same polarity may be contained therein, when the practical amount contained in the intermediate layer 12 is much, in an amount by far smaller than said amount.

Formation of the photosensitive layer 13 may be performed, similarly as in the case of the intermediate layer 12, if it is to be prepared according to the process of the present invention, by introducing a compound containing germanium and halogen into the activation space (A), decomposing these under a high temperature or exciting these through the application of discharging energy or light energy to form active species (A) and introducing said active species (A) into deposition space.

In the case of forming an intermediate layer 12 which is similar to or the same in constituents as the photosensitive layer 13, up to formation of the photoconductive layer 13 can continuously be performed subsequent to formation of the intermediate layer 12.

Further, if desired, it is also possible to form an amorphous deposited film containing carbon and silicon as constituent atoms as the surface layer on the photosensitive layer and, in this case, film formation can also be conducted according to the process of the present invention, similarly as the above intermediate layer and photosensitive layer.

FIG. 2 is a schematic illustration showing a typical example of a PIN type diode device utilizing a deposited film doped with an impurity element prepared by carrying out the process of the present invention.

In the drawing, 21 is a substrate, 22 and 27 are thin film electrodes, 23 is a semiconductor film consisting of an n-type semiconductor layer 24, an i-type semiconductor layer 25 and a p-type semiconductor layer 26. 28 is a conductive wire to be connected to the external electrical circuit.

These semiconductor layers are constructed of A—SiGe(H,X), A—SiGe(N,H,X), A—SiGe(O,H,X), A—SiGeC(H,X), A—Si(H,X), A—SiC(H,X) etc. and the present invention may be applicable for preparation for either one of these layers. Particularly, the semiconductor layer 26 can be prepared according to the process of the present invention to enhance convention efficiency.

As the substrate 21, there may be employed a conductive, semiconductive or insulating substrate.

When the substrate 21 is conductive, the thin film electrode 22 may be omitted. As the semiconductive substrate, there may be employed, for example, semiconductors such as Si, Ge, GaAs, ZnO, ZnS, etc. Thin film electrodes 22, 27 can be obtained by forming thin films of NiCr, Al, Cr, Mo, Au, Ir, Nb, Ta, V, Ti, Pt, Pd, $In_2O_3$, $SnO_2$, ITO($In_2O_3+SnO_2$), etc. on the substrate 21 by treatment such as vacuum deposition, electron beam vapor deposition, sputtering, etc. The electrodes 22, 27 have a film thickness preferably of 30 to $5\times10^4$ Å, more preferably 100 to $5\times10^3$ Å.

For rendering the film constituting the semiconductor layer n-type or p-type, if desired, it can be formed by doping an n-type impurity or a p-type impurity or both impurities into the layer to be formed, while controlling its amount, during layer formation.

For formation of n-type, i-type and p-type semiconductor layers, any one or all of the layers can be formed by the process of the present invention, with the film formation being performed by introducing a compound containing germanium and halogen are introduced into the activation space (A) and decomposing these by the action of an activation energy, whereby active species (A) of, for example, $GeF_2^*$, $SiF_2^*$, etc. can be formed and introduced into the film forming space. Also, separately, a gaseous carbon containing compound and a silicon containing compound, optionally together with an inert gas and a gas containing an impurity element as the component, may be excited and decomposed, if desired, by respecivte activation energies to form respective active species, which are then separately or in an appropriate mixture introduced into the film formaing space in which substrate 11 is placed to form a deposited film. The n-type and p-type semiconductor layers should have a layer thickness preferably of 100 to $10^4$ Å, more preferably 300 to 2000 Å. On the other hand, the i-type semiconductor layer should preferably have a layer thickness preferably of 500 to $10^4$ Å, more preferably 1000 to 10000 Å.

The PIN type diode device shown in FIG. 2 is not necessarily required to prepare all the layers of P, I and N according to the process of the present invention, but the present invention can be carried out by preparing at least one layer of P, I and N according to the process of the present invention.

Furthermore, the process of the present invention is preferably applicable to, other than the above embodiment, forming $Si_3N_4$ insulator films or partially nitrogenated Si films which are formed by the CVD method and constituting semiconductor devices such as IC's, transistors, diodes, photoelectric conversion devices and the like. Also, Si films having a nitrogen concentration distribution in the layer thickness direction by controlling, for example, the time, the amount, etc. of introducing the nitrogen containing compound into the film forming space. Otherwise, in addition to the nitrogen containing compound, hydrogen, halogens, the silicon containing compounds, the germaium containing compounds, the carbon containing compounds, the oxygen containing compounds, etc. may optionally used to form a film involving bonds of N and H, X, Si, Ge, C, O, etc. as constituting units and having desired characteristics.

According to the process for forming a deposited film of the present invention, electrical, optical photoconductive and mechanical charactistics desired for the film to be formed can be improved, and yet a high speed film formation is possible without maintaining the substrate at a high temperature. Also, reproducibility in film formation can be improved to enable movement of the film quality and uniformization of the film quality, and the process is also advantageous in enlargement of area of the film and can easily accomplish improvement of productivity of films as well as bulk production of films. Further, since no special excitation energy is used during film formation, there can be exhibited such effects that film fomration can be effected also on a substrate which is poor in heat resistance of susceptible to plasma etching action, and that the steps can be shortened by low temperature treatment.

The present invention is described in detail by referring to the following Examples.

EXAMPLE 1

Using the apparatus shown in FIG. 3, i-, p- and n-type A—Ge (Si, H, X) deposited films were formed in accordance with the following procedures.

In FIG. 3, a desired substrate 103 is placed on a substrate support 102 in a film forming chamber 101.

A heater 104 is used to preheat the substrate 103 prior to film formation or to anneal the formed film after film formation in order to improve its characteristics. Power is supplied to the heater 104 through wiring 105.

The substrate heating temperature is not particularly limited. However, according to the present invention, the substrate heating temperature is preferably 50° to 150° C., and more preferably 100° to 150° C.

Gas supply sources 106 to 109 are arranged depending on types of gases for film formation, and optionally used inert gases or other impurity-atom containing compounds. When selected gases are liquids in normal state, suitable gasifying units can be used.

Branch pipes 106a to 109a, flowmeters 106b to 109b, pressure gauges 106c to 109c for measuring pressure at higher pressure side of the respective flowmeters, and gas flow regulation valves 106d to 109d and 106e to 109e are arranged for the source 106 to 109. An activation chamber (B) 123 is for producing an active species (B). A microwave plasma generator 122 for generating activation energy for producing the active species (B) is arranged around the chamber 123. A gas for producing the active species (B) is supplied from a gas inlet pipe 110 and activated in the activation chamber (B) 123, and the produced active species (B) is supplied into the chamber 101 through an inlet pipe 124. A gas pressure gauge 111 is connected to the pipe 124.

The apparatus also has an activation chamber (A) 112 and an electric furnace 113. Solid Ge particles 114 are in the chamber 112. An inlet pipe 115 supplies gasified Ge and a halogen compound as a source of the active species (A). The active species (A) produced in the activation chamber (A) 112 is supplied to the chamber 101 through an inlet pipe 116.

When a film consisting of Si in addition to Ge atoms is formed, an activation chamber (C) (not shown) similar to the chamber 112 may be provided separately to produce an active species (SX) from Si, a halogen compound and solid Si particles, and the obtained species may be supplied to the chamber 101.

The interior of the chamber 101 is evacuated through an evacuation valve 120 and an evacuation pipe 121.

In this Example, a polyethylene terephthalate substrate 103 was placed on the support 102, and the chamber 101 was evacuated by a vacuum source to a pressure of about $10^{-6}$ Torr. 150 SCCM of $H_2$ gas or a mixture thereof with 40 SCCM of $PH_3$ or $B_2H_6$ gas (both diluted to 1,000 ppm with hydrogen gas) from a gas bomb 106 was supplied to the activation chamber (B) 123 through the gas inlet pipe 110. The $H_2$ gas, etc. supplied into the chamber (B) 123 were activated by the microwave plasma generator 122 to form activated hydrogen and the like, which were supplied into the film forming chamber 101 through the inlet pipe 124.

The solid Ge particles 114 were placed in the activation chamber (A) 112 and were red-heated by the electric furnace 113. $GeF_4$ was blown from a bomb (not shown) through the inlet pipe 115 so as to produce an active species $GeF_2{}^*$, which was supplied to the chamber 101 through the inlet pipe 116. An active species $SiF_2{}^*$ was similarly supplied to the chamber 101 as needed.

The pressure in the chamber 101 was kept at 0.3 Torr in this manner. Undoped or doped A—Ge (Si, H, X) films (700 Å thickness) were thus formed. The film deposition rate was 11 Å/sec.

The obtained undoped or doped p-type A—Ge (Si, H, X) film sample was placed in a vapor-deposition chamber. An interdigital Al gap electrode (250μ gap length; 5 mm width) was formed at a vacuum pressure of $10^{-5}$ Torr. Thereafter, dark current was measured at an applied voltage of 10 V, dark conductivity $\sigma d$ was calculated, and the characteristics of each film were evaluated. The obtained results are shown in Table 1.

EXAMPLE 2

A—Ge (Si, H, X) films were formed following the same procedures as in Example 1 except that $F_2$ gas (gas ratio of $H_2/F_2=15$) was used in addition to $H_2$ from the gas bomb 106. Dark conductivity of each sample was measured, and the obtained results are shown in Table 1A.

It is seen from Table 1A that A—Ge (Si, H, X) films obtained according to the present invention have excellent electrical characteristics and are well doped.

EXAMPLE 3

Figure 4:
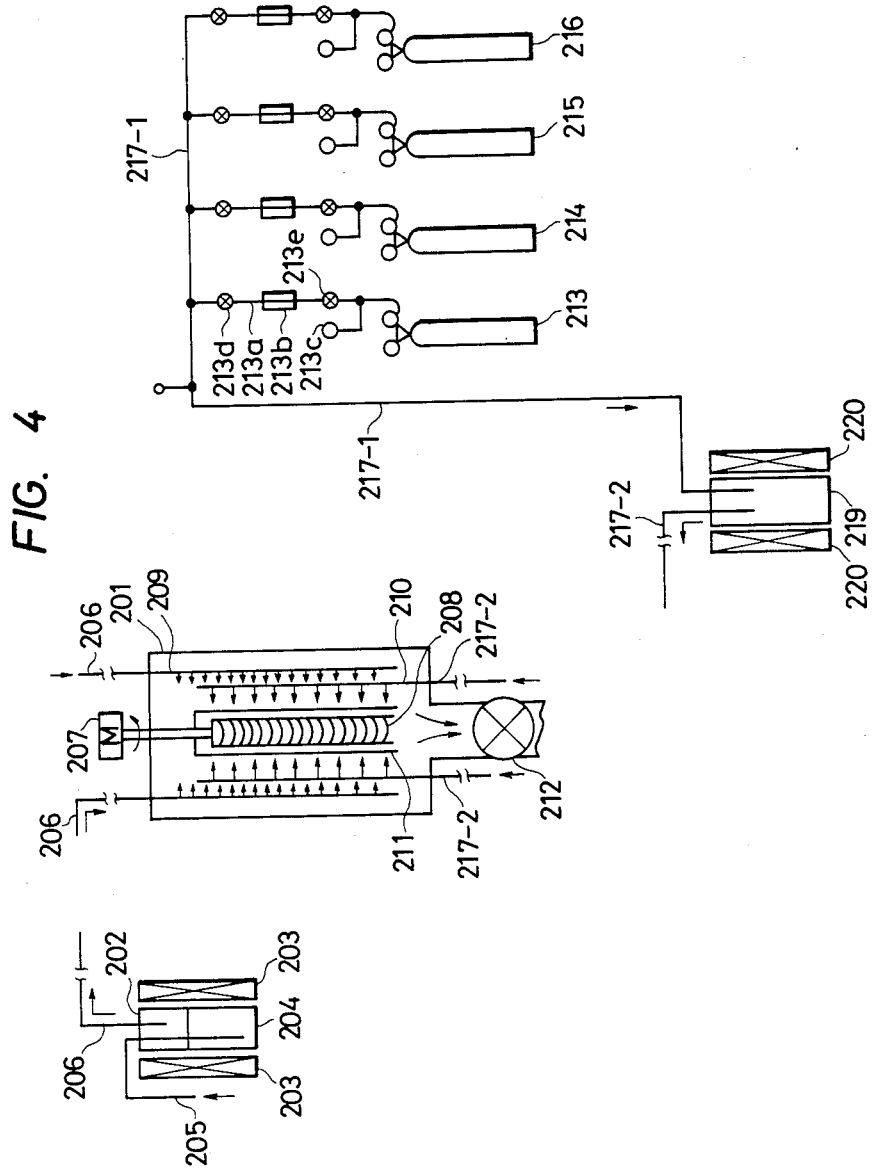

Using the apparatus shown in FIG. 4, a drum-like electrophotographic image forming member having a layer structure shown in FIG. 1 was prepared in accordance with the following procedures.

The apparatus shown in FIG. 4 has a film forming chamber 201, an activation chamber (A) 202, an electric furnace 203, solid Ge particles 204, a source inlet pipe 205 for the active species (A), an active species (A) inlet pipe 206, a motor 207, a heater 208 used in the same manner as the heater 104 in FIG. 3, blow nozzles 209 and 210, an Al cylindrical substrate 211, and an evacuation valve 212. Gas sources 213 to 216 are similar to the gas sources 106 to 109, and are connected to a gas inlet pipe 217-1 through corresponding branched pipes 213a to 216a, flowmeters 213b to 216b, pressure gauges 213c to 216c, and gas flow regulation valves 213d to 216d and 213e to 216e.

The Al cylindrical substrate 211 was suspended in the chamber 201. The heater 208 was arranged in the substrate 211 and was rotated by a motor 207.

The solid Ge particles 204 were placed in the chamber (A) 202 and red-heated by the electric furnace 203. $GeF_4$ was blown through the inlet pipe 206 from a bomb (not shown). $GeF_2{}^*$ as an active species (A) was produced and was then supplied to the chamber 201 through the inlet pipe 206. An active species (SX) of $SiF_2{}^*$ was produced in an activation chamber (C) (not shown) similar to the chamber 202 from the solid Si particles and $SiF_4$ and was supplied to the chamber 201.

$H_2$ gas was supplied to an activation chamber (B) 219 from the inlet pipe 217-1. The supplied $H_2$ gas was activated (converted into a plasma) by a microwave plasma generator 220 to form activated hydrogen in the chamber (B) 219, which was supplied to the chamber 201 through an inlet pipe 217-2. If required, an impurity gas such as $PH_3$ or $B_2H_6$ was also supplied to the chamber (B) 219 and activated.

The Al cylindrical substrate 211 was rotated, and the gas was then exhausted by suitably adjusting the opening of the evacuation valve 212, thereby forming a photosensitive film 13.

Prior to formation of the photosensitive film 13, an intermediate film 12 having a thickness of 2,000 Å was formed by supplying a gas mixture consisting of $H_2/B_2H_6$ (the volume content of $B_2H_6$ was 0.2%) through the inlet pipe 217 in addition to the gas used for forming the film 13 to the chamber 219 and subsequently to the chamber 201.

COMPARATIVE EXAMPLE 1

An electrophotographic drum member having a layer structure as shown in FIG. 1 was formed by the conventional plasma CVD method using $GeF_4$, $SiH_4$, $H_2$ and $B_2H_6$ gas, a film forming chamber as the film forming chamber 201 described above, and an RF generator of 13.56 MHz.

The manufacturing conditions and performance of the electrophotographic drum members obtained in Example 3 and Comparative Example 1 are shown in Table 2A.

EXAMPLE 4

A pin diode like that shown in FIG. 2 was manufactured, using the apparatus shown in FIG. 3.

A polyethylene terephthalate film 21 having a 1,000 Å thick vapor-deposited ITO film 22 was placed on the support 102. After the film forming chamber 101 was evacuated to a pressure of $10^{-6}$ Torr, active species $GeF_2{}^*$ and $SiF_2{}^*$ prepared in the same manner as in Example 1 were introduced into the film forming chamber 101. $H_2$ and $PH_3$ gases (diluted to 1,000 ppm with hydrogen gas) were introduced into the activation chamber (B) 123 and were activated. The activated gases were introduced into the chamber 101 through the gas inlet pipe 116 and a doped n-type A—SiGe (H, X) film 24 (700 Å thickness) was formed.

An undoped A—SiGe (H, X) film 25 (5,000 Å thickness) was formed following the same procedures as in the case of the n-type A—SiGe (H, X) film, except that introduction of $PH_3$ gas was stopped and the ratio of $SiF_2{}^*/GeF_2{}^*$ was doubled.

A p-type A—SiGe (H, X) film 26 (700 Å thickness) doped with B was formed under the same conditions as the n-type A—SiGe (H, X) film, except that $B_2H_6$ gas (diluted to 1,000 ppm with hydrogen gas) was introduced together with the $H_2$ gas. An Al electrode 27 having a thickness of 1,000 Å was formed on the p-type film by vacuum vapor deposition, thereby completing a pin diode. The I-V characteristics of the obtained diode element (area: 1 cm$^2$) were measured, and the rectification and photovoltaic characteristics were evaluated. The obtained results are shown in Table 3A.

A short-circuit current of 10 mA/cm$^2$, a conversion efficiency of 7.8% or more, and an open circuit voltage of 0.92 V were obtained when the light irradiation characteristics of the diode were tested by irradiation with light from the substrate side at a light irradiation intensity AMI of about 100 mW/cm$^2$.

EXAMPLE 5

A pin diode as in Example 4 was manufactured following the same procedures therein, except that $F_2$ gas (gas ratio $H_2/F_2 = 15$) was used in addition to $H_2$ from the pipe 110.

It is seen from Table 3, that the present invention provides an A—SiGe (H, X) pin diode having excellent optical and electrical characteristics when compared with conventional diodes.

EXAMPLE 6

I-, p-, and n-type A—Ge (Si, H, X) films were deposited using an apparatus shown in FIG. 3 in accordance with the following procedures.

In FIG. 3, a desired substrate 103 is placed on a substrate support 102 in a film forming chamber 101.

A substrate heater 104 is used to preheat the substrate 103 before film formation and to anneal the formed film after film formation in order to improve its characteristics. Power is supplied to the heater 104 through wiring 105. The heater 104 is not driven during film formation. The substrate temperature is not particularly limited. However, according to the present invention, the substrate temperature is preferably 50° to 150° C., and more preferably 100° to 150° C.

Gas supply sources 106 to 109 are arranged in accordance with types of gases used, such as Si compounds, hydrogen compounds, halogen compounds, inert gases, and other impurity compounds. When selected gases are liquids in normal state, suitable gasifying units can be used.

Branch pipes 106a to 109a, flowmeters 106b to 109b, pressure gauges 106c to 109c for measuring pressure at higher pressure side of the respective flowmeters, and gas flow regulation valves 106d to 109d and 106e to 109e are arranged for the sources 106 to 109. An activation chamber (B) 123 is for producing an active species (B). A microwave plasma generator 122 for generating activation energy for producing the active species (B) is arranged around the chamber 123. A gas for producing the active species (B) is supplied from a gas inlet pipe 110 and activated in the activation chamber (B) 123, and the produced active species (B) is supplied into the chamber 101 through an inlet pipe 124. A gas pressure gauge 111 is connected to the pipe 124.

The apparatus also has an activation chamber (A) 112 and an electric furnace 113. Solid Ge particles 114 are in the chamber 112. An inlet pipe 115 supplies gasified Ge and a halogen compound as a source of the active species (A). The active species (A) produced in the activation chamber (A) 112 is supplied to the chamber 101 through an inlet pipe 116.

When a film consisting of Si in addition to Ge atoms is formed, an activation chamber (C) (not shown) similar to the chamber 112 may be provided separately to produce an active species (SX) from Si, a halogen compound and a solid Si particles, and the obtained species may be supplied to the chamber 101.

An evacuation pipe 121 with an evacuation valve 120 is connected to the chamber 101.

In this Example, a polyethylene terephthalate substrate 103 was placed on the support 102. The interior of the chamber 101 was evacuated to a pressure of about $10^{-6}$ Torr using a vacuum source. 150 SCCM of $Si_5H_{10}$ or a mixture thereof with 40 SCCM of $PH_3$ or $B_2H_6$ (both diluted to 1,000 ppm with hydrogen gas) was supplied from a gas bomb 106 to the activation chamber (B) 123 through the gas inlet pipe 110. The $Si_5H_{10}$ with or without $PH_3$ or $B_2H_6$ supplied to the activation chamber (B) 123 were activated by the microwave plasma generator 122 to provide activated hydrogen and the like, which were supplied to the film forming chamber 101 through the inlet pipe 124.

The solid Ge particles 114 were placed in the activation chamber (A) 112 and were red-heated by the electric furnace 113. $GeF_4$ was blown from a bomb (not shown) through the inlet pipe 115 to provide $GeF_2^*$ as an active species. The $GeF_2^*$ was supplied to the chamber 101 through the inlet pipe 116. The $SiF_2^*$ was supplied to the chamber 101 as needed in the similar manner.

While the pressure of the chamber 101 was kept at 0.3 Torr, undoped or impurity-doped A—Ge(Si, H, X) films (700 Å thickness) were formed. The film deposition rate was 12 Å/sec.

The obtained undoped or doped A—Ge (Si, H, X) film samples were placed in a vapor-deposition chamber, and interdigital Al electrodes (250µ gap length, 5 mm width) were formed at a vacuum pressure of $10^{-5}$ Torr. Dark current was measured at an applied voltage of 10 V to obtain dark conductivity $\sigma d$, and the film characteristics of the samples were evaluated. The obtained results are shown in Table 1B.

EXAMPLES 7 to 9

A—Ge films were formed following the same procedures as in Example 6 except that straight chain $Si_4H_{10}$, branched $Si_4H_{10}$, and $H_6Si_6F_6$ were used in place of $Si_5H_{10}$. The dark conductivity of each sample film obtained was measured, and the obtained results are shown in Table 1B.

It is seen from Table 1B that, according to the present invention, A—Ge (Si, H, X) films having excellent electrical characteristics can be obtained, and doping can be satisfactorily performed.

EXAMPLE 10

An electrophotographic drum member having a layer structure as shown in FIG. 1 was manufactured using the apparatus as shown in FIG. 4 in accordance with the following procedures.

The apparatus shown in FIG. 4 has a film forming chamber 201, an activation chamber (A) 202, an electric furnace 203, solid Ge particles 204, a source inlet pipe 205 for the active species (A), an active species (A) inlet pipe 206, a motor 207, a heater 208 used in the same manner as the heater 104 in FIG. 3, blow nozzles 209 and 210, an Al cylindrical substrate 211, and an evacuation valve 212. Gas sources 213 to 216 are similar to the gas sources 106 to 109 in FIG. 3, and are connected to a gas inlet pipe 217-1 through corresponding branched pipes 213a to 216a, flowmeters 213b to 216b, pressure gauges 213c to 216c, and gas flow regulation valves 213d to 216d and 213e to 216e.

The Al cylindrical substrate 211 was suspended in the chamber 201. The heater 208 was arranged in the substrate 211 and was rotated by the motor 207.

The solid Ge particles 204 was placed in the chamber (A) 202 and heated to a red hot state by the electric furnace 203. GeF$_4$ was blown from a bomb (not shown) through the inlet pipe 206. GeF$_2$* as an active species (A) was produced and was then supplied to the chamber 201 through the inlet pipe 206.

Si$_2$H$_6$ and H$_2$ gases were supplied to an activation chamber (B) 220 from the inlet pipe 217-1, and were activated (converted into plasmas) by a microwave plasma generator 220 to form activated hydrogen, which was supplied to the chamber 201 through an inlet pipe 217-2. If required, an impurity gas such as PH$_3$ or B$_2$H$_6$ was also supplied to the chamber (B) 219 and activated.

The Al cylindrical substrate 211 was rotated. The gas was then exhausted by suitably adjusting the opening of the evacuation valve 212, thereby forming a photosensitive film 13.

Prior to formation of the photosensitive film 13, an intermediate film 12 having a thickness of 2,000 Å was formed by supplying a gas mixture consisting of H$_2$ and B$_2$H$_6$ (the volume content of B$_2$H$_6$ was 0.2%) through the inlet pipe 217-1.

COMPARATIVE EXAMPLE 2

Electrophotographic drum members having a layer structure as shown in FIG. 1 were manufactured by the conventional plasma CVD method using GeF$_4$, Si$_2$H$_6$, H$_2$ and B$_2$H$_6$ gases, a film forming chamber as the film forming chamber 201 and an RF generator of 13.56 MHz.

The manufacturing conditions and performance of the electrophotographic drum members obtained in Example 6 and Comparative Example 2 are shown in Table 2B.

EXAMPLE 11

A pin diode like that shown in FIG. 2 was manufactured, using Si$_3$H$_6$ as an Si compound, with the apparatus shown in FIG. 3.

A polyethylene terephthalate film 21 having a 1,000 Å thick ITO film 22 deposited thereon was placed on the support 102, and the chamber interior was evacuated to a pressure of 10$^{-6}$ Torr. The active species GeF$_2$* produced in the same manner as in Example 1 was introduced into the film forming chamber 101. Si$_3$H$_6$, H$_2$, and PH$_3$ gases (diluted to 1,000 ppm with hydrogen gas) were introduced into the activation chamber (B) 123 and were activated.

The activated gases were introduced into the chamber 101 through the gas inlet pipe 116. While the pressure in the chamber 101 was kept at 0.1 Torr, an n-type A—SiGe (H, X) film 24 (700 Å thickness) doped with P was formed.

An undoped A—SiGe (H, X) film 25 (5,000 Å thickness) was formed by the same method as in the case of the n-type A—SiGe (H, X) film, except that supply of PH$_3$ gas was stopped.

A p-type A—SiGe (H, X) film 26 (700 Å thickness) doped with B was formed under the same conditions as the n-type A—SiGe (H, X) film, except that B$_2$H$_6$ (diluted to 1,000 ppm with hydrogen gas) was used with H$_2$ gas. An Al electrode 27 having a thickness of 1,000 Å was formed on the p-type A—SiGe (H, X) film by vacuum vapor deposition to obtain a pin diode.

The I-V characteristics of the obtained diode element (1 cm$^2$ area) were measured, and the rectification and photovoltaic characteristics were evaluated. The obtained results are shown in Table 3B.

A short-circuit current of 10.2 mA/cm$^2$, a conversion efficiency of 7.8% or more and an open circuit voltage of 0.91 V were obtained when the light irradiation characteristics of the diode were examined by irradiation with light from the substrate side at a light irradiation intensity AMI of about 100 mW/cm$^2$.

EXAMPLES 12 to 14

A pin diode as in Example 11 was manufactured following the same procedures therein, except that straight chain Si$_4$H$_{10}$, branched Si$_4$H$_{10}$, or H$_6$Si$_6$F$_6$ was used in place of Si$_3$H$_6$ as an Si-containing compound. The rectification and photovoltaic characteristics of the diode were evaluated, and the obtained results are shown in Table 3B.

It is seen from Table 3B that the present invention provides an A—SiGe (H, X) pin diode having excellent optical and electrical characteristics when compared with conventional diodes.

EXAMPLE 15

Using the apparatus shown in FIG. 3, i-, p- and n-type Ge- and C-containing amorphous deposited films were formed in accordance with the following procedures.

In FIG. 3, a desired substrate 103 is placed on an inner substrate support 102 of a film forming chamber 101.

A heater 104 is used to preheat the substrate 103 prior to film formation or to anneal the formed film after film formation in order to improve its characteristics. Power is supplied to the heater 104 through wiring 105. The heater 104 is not driven during film formation.

Gas supply sources 106 to 109 are arranged in accordance with types of gases used, such as carbon-containing compounds, and optionally used hydrogen, halogen compounds, inert gases, and other impurity atom-containing compounds. When selected gases are liquids in normal state, suitable gasifying units can be used.

Branched pipes 106a to 109a, flowmeters 106b to 109b, pressure gauges 106c to 109c for measuring pressure at higher pressure side of respective flowmeters, and gas flow regulation valves 106d to 109d and 106e to 109e are arranged for the sources 106 to 109. An activation chamber (B) 123 is for producing an active species (B). A microwave plasma generator 122 for generating activation energy for producing an active species (B) is arranged around the chamber 123. A gas for producing the active species (B) is supplied from a gas inlet pipe 110 and activated in the activation chamber (B) 123, and the produced species (B) is supplied into the chamber 101 through an inlet pipe 124. A gas pressure meter 111 is connected to the pipe 124.

The apparatus also has an activation chamber (A) 112 and an electric furnace 113. Solid Ge particles 114 are in the chamber 112. An inlet pipe 115 supplies gasified Ge and a halogen compound as a source of the active species (A). The active species (A) produced in the activation chamber (A) 112 is supplied to the chamber 101 through an inlet pipe 116.

The interior of the chamber 101 is evacuated through an evacuation valve 120 and an evacuation pipe 121.

In this Example, a polyethylene terephthalate film substrate 103 was placed on the support 102, and the chamber 101 was evacuated by a vacuum source to a pressure of about $10^{-6}$ Torr. $CH_4$ gas or a mixture thereof with 40 SCCM of $PH_3$ or $B_2H_6$ gas (both diluted to 1,000 ppm with hydrogen gas) from gas bomb 106 was supplied to the activation chamber (B) 123 through the gas inlet pipe 110. The $CH_4$ gas etc. supplied into the chamber (B) 123 were activated by the microwave plasma generator 122 to form a hydrogeneraged carbon active species and activated hydrogen, which were supplied into the chamber 101 through the inlet pipe 124.

The solid Ge particles 114 placed in the chamber (A) 112 were red-heated by the electric furnace 113. $GeF_4$ was blown from a bomb (not shown) through the inlet pipe 115 so as to produce an active species (A) $GeF_2^*$, which was supplied to the chamber 101 through the inlet pipe 116.

The pressure in the chamber 101 was kept at 0.4 Torr. Undoped and doped Ge- and C-containing amorphous films (700 Å thickness) were thus formed. The film deposition rate was 18 Å/sec.

The undoped or doped p-type A—SiGe (H, X) film sample was placed in a vapor deposition chamber. An interdigital Al gap electrode ($250\mu$ gas length: 5 mm width) was formed at a vacuum pressure of $10^{-5}$ Torr. Thereafter, dark current was measured at an applied voltage of 10 V, dark conductivity $\sigma$d was calculated, and the characteristics of each film were evaluated. The obtained results are shown in Table 1C.

EXAMPLES 16 to 18

Ge- and C-containing amorphous films were formed following the same procedures as in Example 15 except that straight chain $C_2H_6$, $C_2H_4$ or $C_2H_2$ was used in place of $CH_4$. Dark conductivity of each sample was measured, and the obtained results are shown in Table 1C.

It is seen from Table 1C that Ge- and C-containing amorphous films obtained according to the present invention as well doped.

EXAMPLE 19

Using the apparatus shown in FIG. 4, a drumlike electrophotographic image forming member having a layer structure shown in FIG. 1 was prepared in accordance with the following procedures.

The apparatus shown in FIG. 4 has a film forming chamber 201, an activation chamber (A) 202, an electric furnace 203, a solid Ge particles 204, a source inlet pipe 205 for the active species (A), an active species (A) inlet pipe 206, a motor 207, a heater 208 used in the same manner as the heater 104 in FIG. 3, blow-off nozzles 209 and 210, an Al cylindrical substrate 211, and an evacuation valve 212. Gas sources 213 to 216 are similar to the gas sources 106 to 109, and are connected to a gas inlet pipe 217-1 through corresponding branched pipes 213a to 216a, flowmeters 213b to 216b, pressure meters 213c to 216c, and gas flow regulation valves 213d to 216d and 213e to 216e.

The Al cylindrical substrate 211 was suspended in the chamber 201. The heater 208 was arranged in the substrate 211 and was rotated by a motor 207.

The solid Ge particles 204 was placed in the chamber (A) 202 and heated to a red heat state by the electric furnace 203. $GeF_4$ was blown from a bomb (not shown) through the inlet pipe 206. $GeF_2^*$ as an active species (A) was produced and was then supplied to the chamber 201 through the inlet pipe 206.

$CH_4$, $Si_2H_6$, and $H_2$ gases were supplied to an activation chamber (B) 219 from the inlet pipe 217-1.

The supplied $CH_4$, $Si_2H_6$, and $H_2$ gases were activated by a microwave plasma generator 220 into a hydrogenated carbon active species, a hydrogeneated Si active species, and activated hydrogen, which were supplied to the chamber 201 through an inlet pipe 217-2. If required, an impurity gas such as $PH_3$ or $B_2H_6$ is also supplied to the chamber (B) 219 and activated. The internal pressure of the chamber 201 was kept at 1.0 Torr.

The Al cylindrical substrate 211 was rotated, and the gas was then exhausted by suitably adjusting the opening of the evacuation valve 212, thereby forming a photosensitive film 13.

Prior to formation of the photosensitive layer 13, an intermediate layer 12 having a thickness of 2,000 Å was formed by supplying a gas mixture consisting of $H_2$ and $B_2H_6$ (the volume content of $B_2H_6$ was 0.2%) through the inlet pipe 217-1 to the chamber 219 and subsequently to the chamber 201.

COMPARATIVE EXAMPLE 3

An electropotographic image forming member having a layer structure as shown in FIG. 1 was formed by the conventional plasma CVD method using $GeF_4$, $CH_4$, $Si_2H_6$, $H_2$, and $B_2H_6$ gases, a film forming chamber as the film forming chamber 201 provided with high frequency generator of 13.56 MHz.

The manufacturing conditions and performance of the electrophotographic drum members obtained in Example 19 and Comparative Example 3 are shown in Table 2C.

EXAMPLE 20

A pin diode like that shown in FIG. 2 was manufactured, using $CH_4$ as a C compound, with the apparatus shown in FIG. 3.

A polyethylene terephthalate film 21 having a 1,000 Å thick ITO film 22 was placed on the support 102. After the film forming chamber 101 was evacuated to a pressure of $10^{-6}$ Torr, an active species $GeF_2^*$ prepared in the same manner as in Example 1 was introduced in the chamber 101. $Si_3H_6$ and $PH_3$ gases (diluted to 1,000 ppm with hydrogen gas) were introduced into the activation chamber (B) 123 and were activated.

The activated gases were introduced into the chamber 101 through the gas inlet pipe 116 and an n-type A-SiGe (H, X) film 24 (700 Å thickness) doped with P was formed by keeping the pressure in the chamber 101 at 0.3 Torr.

An undoped A—SiGe (H, X) film 25 (5,000 Å thickness) was formed following the same procedures as in the case of the n-type A—SiGe (H, X) film, except that supply of $PH_3$ gas was stopped.

A p-type carbon-containing A—SiGeC (H, X) film 26 (700 Å thickness) doped with B was formed under the same conditions as the n-type film, except that $CH_4$ and $B_2H_6$ gases (diluted to 1,000 ppm with hydrogen gas) were introduced together with $Si_3H_6$ gas. An Al electrode 27 having a thickness of 1,000 Å was formed on the p-type film by vacuum deposition, thereby completing a pin diode.

The I-V characteristics of the obtained diode element (area: 1 cm$^2$) were measured, and the rectification and photovoltaic characteristics were evaluated. The obtained results are shown in Table 3C.

When the light irradiation characteristics of the diode were tested by irradiation light from the substrate side at a light irradiation intensity AMI of about 100 mW/cm$^2$, there were obtained a short-circuit current of 9.8 mA/cm$^2$, a conversion efficiency of 8.2% or more, and an open circuit voltage of 0.93 V.

EXAMPLES 21 to 23

Pin diodes similar to that in Example 20 were manufactured according to the same procedures therein, except that $C_2H_4$ or $C_2H_2$ was used in place of $CH_4$ as carbon compounds. The rectification and photovoltaic characteristics of the obtained sample were evaluated, and the obtained results are shown in Table 3C.

It is seen from Table 3C, that the present invention provides a C-containing A—SiGe (H, X) pin diode having excellent optical and electrical characteristics when compared with conventional diodes.

EXAMPLE 24

I-, p-, and n-type A—SiGe (H, X) films were deposited using an apparatus shown in FIG. 3 in accordance with the following procedures.

In FIG. 3, a desired substrate 103 is placed on a substrate support 102 inside a film forming chamber 101.

A substrate heater 104 is used to preheat the substrate 103 before film deposition and to anneal the formed film in order to improve its characteristics. Power is supplied to the heater 104 through wiring 105. The heater 104 is not driven during film formation.

Gas supply sources 106 to 109 are arranged in accordance with types of gases used, such as Ge-containing compounds, and optionally used hydrogen, halogen compounds, inert gases, Si-containing compounds, carbon-containing compounds, and other impurity atom-containing compounds. When selected gases are liquids in normal state, conventional gasifying units can be used.

Branch pipes 106a to 109a, flowmeters 106b to 109b, pressure meters 106c to 109c for measuring pressure at higher pressure of respective flowmeters, and gas flow regulation valves 106d to 109d and 106e to 109e are arranged for the sources 106 to 109. An activation chamber (B) 123 is for producing an active species (B). A microwave plasma generator 122 for generating activation energy for producing the active species (B) is arranged around the chamber 123. A gas for producing the active species (B) is supplied from a gas inlet pipe 110 and activated in the activation chamber (B) 123, and the produced active species (B) is supplied into the chamber 101 through an inlet pipe 124.

A gas pressure meter 111 is connected to the pipe 124. The apparatus also has an activation chamber (A) 112 and an electric furnace 113. A solid Ge particles 114 is in the chamber 112. An inlet pipe 115 supplies gasified Ge and a halogen compound as a source of the active species (A). The active species (A) produced in the activation chamber (A) 112 is supplied to the chamber 101 through an inlet pipe 116.

An evacuation pipe 121 with an evacuation valve 120 is connected to the chamber 101.

In this Example, a polyethylene terephthalate substrate 103 was placed on the support 102. The interior of the chamber 101 was evacuated to a pressure of about $10^{-6}$ Torr using a vacuum source. 150 SCCM of $GeH_4$ or a mixture thereof with 40 SCCM of $PH_3$ or $B_2H_6$ (both diluted to 1,000 ppm with hydrogen gas) was supplied from a gas bomb 106 to the activation chamber (B) 123 through the gas inlet pipe 110.

The $GeH_4$ gas etc. supplied to the activation chamber (B) 123 were activated by the microwave plasma generator 122 to provide hydrogenerated Ge active species and the like, which was supplied to the chamber 101 through the inlet pipe 124.

The solid Ge particles 114 was placed in the activation chamber (A) 112 and was heated by the electric furnace 113 to a red heat state. $GeF_4$ was blown from a bomb (not shown) through the inlet pipe 115 to provide $GeF_2^*$ as an active species. The $GeF_2^*$ was supplied to the chamber 101 through the inlet pipe 106.

While the pressure of the chamber 101 was kept at 0.4 Torr, undoped and an impurity-doped A-Ge (H, X) films (700 Å thickness) were formed. The film forming rate was 12 Å/sec The obtained p-type A-Ge (H, X) film samples were placed in a vapor diposition chamber, and interdigital Al electrodes (250$\mu$ gap length, 5 mm width) were formed at a vacuum pressure of $10^{-5}$ Torr. Dark current was measured at an applied voltage of 10 V to obtain dark conductivity $\sigma d$, and the film characteristics of the samples were evaluated. The obtained results are shown in Table 1D.

EXAMPLES 25 to 27

A-Ge (H, X) films were formed following the same procedures as in Example S4 except that straight chain $Ge_4H_{10}$, branched $Ge_4H_{10}$, or $H_6Ge_6F_6$ were used in place of $GeH_4$. The dark conductivity of each sample film obtained was measured, and the obtained results are shown in Table 1D.

It is seen from Table 1D that, according to the present invention, A—SiGe (H, X) films having excellent electrical characteristics can be obtained, and doping can be satisfactorily performed.

EXAMPLE 28

An electrophotographic drum-like member having a layer structure as shown in FIG. 1 was manufactured using the apparatus as shown in FIG. 4.

The apparatus shown in FIG. 4 has a film forming chamber 201, an activation chamber 202, an electric furnace 203, a solid Ge particles 204, a source inlet pipe 205 for the active species (A), an active species (A) inlet pipe 206, a motor 207, a heater 208 used in the same manner as the heater 104 in FIG. 3, blow-off nozzles 209 and 210, an Al cylindrical substrate 211, and an evacuation valve 212. Gas sources 213 to 216 are similar to the gas sources 106 to 109, and are connected to a gas inlet pipe 217-1.

The Al cylindrical substrate 211 is suspended in the chamber 201. The heater 208 is arranged in the substrate 211 and is rotated by a motor 207.

The solid Ge mass 204 was placed in the chamber (A) 202 and heated to a red heat state by the electric furnace 203. $GeF_4$ was blown from a bomb (not shown) through the inlet pipe 206. $GeF_2^*$ as an active species (A) was produced and was then supplied to the chamber 201 through the inlet pipe 206.

$Si_2H_6$, $GeH_4$, and $H_2$ gases were supplied to an activation chamber (B) 220 from the inlet pipe 217-1, and were activated by a microwave plasma generator 220 into hydrogenated Si active species, hydrogenated Ge active species and activated hydrogen, which were supplied to the chamber 201 through an inlet pipe 217-2. If required, an impurity gas such as $PH_3$ or $P_2H_6$ is also supplied to the chamber (B) 219 and activated. The internal pressure of the chamber 201 was kept at 1.0 Torr.

The Al cylindrical substrate 211 was rotated. The gas was then exhausted through the evacuation valve 212, thereby forming a photosensitive film 13.

Prior to formation of the photosensitive film 13, an intermediate film 12 having a thickness of 2,000 Å was formed by supplying a gas mixture consisting of $Si_2H_6$, $GeH_4$, $H_2$, and $B_2H_6$ (the volume content of $B_2H_6$ was 0.2%) through the inlet pipe 217-1.

COMPARATIVE EXAMPLE 4

Electrophotographic drum-like image forming members having a layer structure as shown in FIG. 1 were manufactured by the conventional plasma CVD method using $GeF_4$, $Si_2H_6$, $GeH_4$, $H_2$, and $B_2H_6$ gases, a film forming chamber as the film forming chamber 201 provided with high frequency generator of 13.56 MHz.

The manufacturing conditions and performance of the electrophotographic drum-like members obtained in Example 28 and Comparative Example 4 are shown in Table 2D.

EXAMPLE 29

A pin diode like that shown in FIG. 2 was manufactured, using $GeH_4$ as a Ge-containing compound, with the apparatus shown in FIG. 3.

A polyethylene terephthalate film 21 having a 1,000 Å thick ITO film 22 deposited thereon was placed on the support 102, and the chamber interior was evacuated to a pressure of $10^{-6}$ Torr. The active species $GeF_2^*$ was introduced into the film forming chamber 101 in the same manner as in Example 1. 150 SCCM of $Si_3H_6$, 50 SCCM of $GeH_4$, and $PH_3$ gases (diluted to 1,000 ppm with hydrogen gas) were introduced into the activation chamber (B) 123 through the pipe 110 and were activated. The activated gases were introduced into the chamber 101 through the gas inlet pipe 116. The pressure in the chamber 101 was kept at 0.1 Torr and an n-type A—SiGe (H, X) film 24 (700 Å thickness) doped with P was formed.

An i-type A—SiGe (H, X) film 25 (5,000 Å thickness) was formed by the same method as in the case of the n-type A—SiGe (H, X) film, except that $B_2H_6$ gas (diluted to 300 ppm with hydrogen gas) was used in place of the $PH_3$ gas.

A p-type A—SiGe (H, X) film 26 (700 Å thickness) doped with B was formed under the same conditions as the n-type A—SiGe (H, X) film, except that $B_2H_6$ (diluted to 1,000 ppm with hydrogen gas) was used in place of $PH_3$ gas. An Al electrode 27 having a thickness of 1,000 Å was formed on the p-type film by vaccum vapor deposition to obtain a pin diode.

The I-V characteristics of the obtained diode element (1 cm$^2$ area) were measured, and the rectification and photovoltaic characteristics were evaluated. The obtained results are shown in Table 3D.

When the light irradiation characteristics of the diode were examined by irradiating light from the substrate side at a light irradiation intensity AMI of about 100 mW/cm$^2$, there were obtained a short-circuit current of 11.5 mA/cm$^2$, a conversion efficiency of 6.8% or more and an open end voltage of 0.87 V.

EXAMPLES 30 to 32

A pin diode as in Example 29 was manufactured following the same procedures therein, except that straight chain $Ge_4H_{10}$, branched $Ge_4H_{10}$, and $H_6Ge_6F_6$ were used in place of $GeH_4$ as a Ge-containing compound. The rectification and photovoltaic characteristics of the diode were evaluated, and the obtained results are shown in Table 3D.

It is seen from Table 3D that the present invention provides an A—SiGe (H, X) pin diode having excellent optical and electrical characteristics when compared with conventional diodes.

EXAMPLE 33

Using the apparatus shown in FIG. 3, i-, p- and n-type oxygen containing amorphous deposited films were formed in accordance with the following procedures.

In FIG. 3, a desired substrate 103 is placed on an inner substrate support 102 of a film forming chamber 101.

A heater 104 is used to preheat the substrate 103 prior to film formation or to anneal the formed film after film formation in order to improve its characteristics. Power is supplied to the heater 104 through wiring 105. The heater 104 is not driven during film deposition.

Gas supply sources 106 to 109 are arranged in accordance with types of gases used, such as oxygen containing compounds, and optionally used hydrogen, halogen compounds, inert gases, Si compounds, C compounds, Ge compounds and other impurity atom containing compounds. When selected gases are liquids in standard state, suitable gasifying units can be used.

Branched pipes 106a to 109a. flowmeters 106b to 109b, pressure gauges 106c to 109c for measuring pressure at higher pressure side of the respective, gas flow meters and gas flow regulation valves 106d to 109d and 106e 109e are arranged for the sources 106 to 109.

An activation chamber (B) 123 is for producing an active species (B). A microwave plasma generator 122 for generating activation energy for producing an active species (B) is arranged around the chamber 123. A gas for producing the active species (B) is supplied from a gas inlet pipe 110 and activated in the activation chamber (B) 123, and the produced species (B) is supplied into the chamber 101 through an inlet pipe 124. A gas pressure gauge 111 is connected to the pipe 124.

The apparatus also has an activation chamber (A) 112 an electric furnace 113. Solid Ge particles 114 are in the chamber 112. An inlet pipe 115 supplies gasified Ge and a halogen compound as a source of the active species (A). The active species (A) produced in the activation chamber (A) 112 is supplied to the chamber 101 through an inlet pipe 116.

The interior of the chamber 101 is evacuated through an evacuation valve 120 and an evacuation pipe 121.

In this Example, a polyethylene terephthalate film substrate 103 wqs placed on the support 102, and the chamber 101 was evacuated by a vacuum source to a pressure of about $10^{-6}$ Torr. 150 SCCM of $O_2$ gas (diluted to 10% by volume with He gas) or a mixture thereof with 40 SCCM of $PH_3$ or $B_2H_6$ gas (both diluted to 1,000 ppm with hydrogen gas) from gas bomb 106 was supplied to the activation chamber (B) 123 through the gas inlet pipe 110. The $O_2$ gas, etc. supplied into the chamber (B) 123 for activated by the microwave plasma generator 122 to form activated hydrogen and the like, which were supplied into the chamber 101 through the inlet pipe 124.

The solid Ge particles 114 placed in the chamber (A) 112 were red heated by the electric furnace 113. $GeF_4$ was blown from a bomb (not shown) through the inlet pipe 115 so as to produce an active species (A) $GeF_2^*$, which was supplied to the chamber 101 through the inlet pipe 116.

The pressure in the chamber 101 was kept at 0.4 Torr and undoped or doped O-containing amorphous deposited films (700 Å thickness) were thus formed.

Each of the updoped or doped p-type film sample was placed in a vapor deposition chamber. An interdigital Al gap electrode (250μ gap length; 5 mm width) was formd at a vaccum pressure of $10^{-5}$ Torr. Thereafter, dark current was measured at an applied voltage of 10 V, dark conductivity σd was calculated, and the characteristics of each film were evaluated. The obtained results are shown in Table 1E.

EXAMPLES 34 to 36

Oxygen containing amorphous deposited films were formed following the same procedures as in Example 33 except that $O_2$ (diluted to 10% by volume with He gas), and each of $Si_2F_6$, $Ge_2H_6$ and $C_2H_6$ were supplied to the activation chamber (B) at a ratio of 1:9 to produce an active species (B). Dark conductivity of each sample was measured, and the obtained results are shown in Table 1E.

It is seen from Table 1E that oxygen containing amorphous deposited films obtained according to the present invention have excellent electrical characteristics and are well doped.

EXAMPLES 37 to 40

Oxygen containing amorphous deposited films were formed following the same procedures as in Example 33 except that $H_3SiOSiH_3$, $H_3GeOGeH_3$, $CO_2$, or $OF_2$ was used in place of $O_2$.

The obtained oxygen containing amorphous deposited films had excellent electrical characteristics and were well doped.

EXAMPLE 41

Using the apparatus shown in FIG. 4, a drumshaped electrophotographic image forming member having a layer structure shown in FIG. 1 was prepared in accordance with the following procedures.

The apparatus shown in FIG. 4 has a film forming chamber 201, an activation chamber (A) 202, an electric furnace 203, solid Ge particles 204, a source inlet pipe 205 for the active species (A), an active species (A) inlet pipe 206, a motor 207 a heater 208 used in the same manner as the heater 104 in FIG. 3, blow nozzles 209 and 210, an Al cylindrical substrate 211, and an evacuation valve 212. Gas sources 213 to 216 are similar to the gas sources 106 to 109 in FIG. 3, and are connected to a gas inlet pipe 217-1 through corresponding branch pipes 213a to 216a, flowmeters 213b to 216b, pressure meters 213c to 216c and gas flow regulation valves 213d to 216d and 213e to 216e.

The Al cylindrical substrate 211 was suspended in the chamber 201. The heater 208 was arranged in the substrate 211 and was rotated by a motor 207.

The solid Ge particles 204 were red heated by the electric furnace 203. $GeF_4$ was blown through the inlet pipe 203. $GeF_2^*$ as an active species (A) was produced and was then supplied to the chamber 201 through the inlet pipe 206.

$O_2$, $Si_2F_6$ and $H_2$ gases were supplied to an activation chamber (B) 219 through the inlet pipe 217-1.

The supplied $O_2$ gas and $H_2$ gas were activated (converted into plasma) by a microwave plasma generator 220 into activated oxygen and activated hydrogen, which were supplied to the chamber 201 through an inlet pipe 217-2. If required, an impurity gas such as $PH_3$ or $B_2H_6$ is also supplied to the chamber (B) 219 and activated. The internal pressure of the chamber 201 was kept at 1.0 Torr.

The Al cylindrical substrate 211 was rotated, and the gas was then exhausted by suitably adjusting the opening of the evacuation valve 212, thereby forming a photosensitive layer 13.

Prior to formation of the photosensitive layer 13, an intermediate layer 12 having a thickness of 2000 Å was formed by supplying a gas mixture consisting of $Si_2F_6$ and $O_2$ ($Si_2F_6:O_2=1:10^{-5}$), He and $B_2H_6$ (the volume content of $B_2H_6$ was 0.2% by volume) through the inlet pipe 217-1 to the chamber 201.

COMPARATIVE EXAMPLE 5

A drum shaped electrophotographic image forming member having a layer structure as shown in FIG. 1 was formed by the conventional plasma CVD method using $GeF_4$ gas, a gas mixture of $Si_2F_6$, $O_2$, He and $B_2H_6$ gases. a film forming chamber similar to the film forming chamber 201 described above, and high frequency generator of 13.56 MHz.

The preparing conditions of the drum shaped electrophotographic image forming members obtained in Example 41 and Comparative Example 5 are shown in Table 2E.

EXAMPLE 42

A PIN diode like that shown in FIG. 2 was manufactured, using $O_2$ as an oxygen containg compound, with the apparatus shown in FIG. 3.

A polyethylene naphthalate film 21 having a 1,000 Å thick ITO film 22 vapor deposited thereon was placed on the support 102. After the film forming chamber 101 was evacuated to a pressure of $10^{-6}$ Torr, an active species $GeF_2^*$ prepared in the same manner as in Example 33 was introduced in the chamber 101. $Si_3F_6$ and $PH_3$ gases (diluted to 1,000 ppm with hydrogen gas) were introduced into the activation chamber (B) 123 and were activated.

The activated gases were introduced into the chamber 101 through the inlet pipe 124 and an n-type A—SiGe (H, X) film 24 (700 Å thickness) doped with P was formed by keeping the pressure in the chamber 101 at 0.3 Torr.

An undoped A—SiGe (H, X) film 25 (5,000 Å thickness) was formed following the same procedures as in the case of the n-type A—SiGe (H,X) film, except that supply of the $PH_3$ gas was stopped.

A p-type oxygen-containing A—SiGeo (H, X) film 26 (700 Å thickness) doped with B was formed under the same conditions as the n-type film, except that $O_2$ and $B_2H_6$ gases (diluted to 1,000 ppm with hydrogen gas) were introduced together with the Si F gas. An Al electrode 27 having a thickness of 1,000 Å was formed on the p-type film by vacuum deposition, thereby completing a PIN diode.

The I-V characteristics of the obtained diode element (area, 1 cm$^2$) were measured, and the rectification and photovoltaic characteristics were evaluated. The obtained results are shown in Table 3E.

A short-circuit current of 10.3 mA/cm² was obtained when the light irradiation characteristics of the diode were tested by irradiating the diode element with light from the substrate side at a light irradiation intensity AMI of about 100 mW/cm², a conversion efficiency of 8.3% or more, and an open circuit voltage of 0.94 v.

EXAMPLES 39 to 41

PIN diodes the same as in Example 38 were manufactured following the same procedures therein, except that $H_3SiOSiH_3$, $H_3GeOGeH_3$ and $CO_2$ were used in place of $O_2$. The rectification and photovoltaic characteristics of the obtained samples were evaluated, and the obtained results are shown in Table 3E.

It is seen from Table 3E, that the present invention provides an oxygen containing A—SiGe(H, X) PIN diode having excellent optical and electrical characteristics when compared with conventional diodes.

EXAMPLE 42

I-, p-, and n-type nitrogen containing amorphous films were deposited using an apparatus shown in FIG. 3 in accordance with the following procedures.

In FIG. 3., gas supply sources 106 to 109 are arranged in accordance with types of gases used, such as nitrogen containing compounds, and optionally used hydrogen, halogen compounds, inert gases, Si containing compounds, C containing compounds, Ge containing compounds, oxygen containing compounds, and other impurity atom containing compounds. When selected gases are liquids in standard state, conventional gasifying units can be used.

Branched pipes 106a to 109a, flowmeters 106b to 109b, pressure gauges 106c to 109c, and gas flow regulation valves 106d to 109d and 106e to 109e are arranged for the sources 106 to 109. An activation chamber (B) 123 is for producing an active species (B). A microwave plasma generator 122 for generating activation energy for producing the active species (B) is arranged around the chamber 123. A gas for producing the active species (B) is supplied from a gas inlet pipe 110 and activated in the activation chamber (B) 123, and the produced active species (B) is supplied into the chamber 101 through an inlet pipe 124.

A gas pressure gauge 111 is connected to the pipe 124. The apparatus also has an activation chamber (A) 112 and an electric furnace 113. Solid Ge particles 114 are in the chamber 112. An inlet pipe 115 supplies gasified Ge and a halogen compound as a source of the active species (A). The active species (A) produced in the activation chamber (A) 112 is supplied to the chamber 101 through an inlet pipe 116.

An evacuation pipe 121 with an evacuation valve 120 is connected to the chamber 101.

In this Example, a polyethylene terephthalate film substrate 103 was placed on the support 102. The interior of the chamber 101 was evacuated to a pressure of about $10^{-6}$ Torr using a vacuum source (not shown). 150 SCCM of $N_2$ or a mixture thereof with 40 SCCM of $PH_3$ or $B_2H_6$ (both diluted to 1,000 ppm with hydrogen gas) was supplied from a gas bomb 106 to the activation chamber (B) 123 through the gas inlet pipe 110. The $N_2$ gas etc. supplied to the activation chamber (B) 123 were activated by the microwave plasma generator 122 to provide activated nitrogen and the like, which were supplied to the chamber 101 through the inlet pipe 124.

The solid Ge particles 114 placed in the activation chamber (A) 112 was red heated by the electric furnace 113 (about 1,100° C). $GeF_4$ was blown from a bomb (not shown) through the inlet pipe 115 to provide $GeF_2^*$ as an active species. The $GeF_2^*$ was supplied to the chamber 101 through the inlet pipe 106.

While the inner pressure of the chamber 101 was kept at 0.4 Torr, undoped or doped N-containing amorphous deposited films (700 Å thickness) were formed. The film deposition rate was 14 Å/sec The obtained undoped, p-type and n type film samples were placed in a vapor deposition chamber, and interdigital Al electrodes (250μ gap length, 5 mm width) were fomred at a vacuum pressure of $10^{-5}$ Torr. Dark current was measured at an applied voltage of 10 V to obtain dark conductivity σd, and the film characteristics of the samples were evaluated. The obtained results are shown in Table 1F.

EXAMPLES 43 to 45

Nitrogen containing amorphous deposited films were formed following the same procedures as in Example 42 except that $Si_2H_6$, $Ge_2H_6$ and $C_2H_6$ were used toqether with $H_2$. The dark conductivity of each sample film obtained was measured, and the obtained results are shown in Table 1F.

It is seen from Table 1F that, according to the present invention, nitrogen containing amorphous deposited films having excellent electrical characteristics can be obtained, and doping and can be satisfactorily performed.

EXAMPLES 46 to 49

Nitrogen contining amorphous deposited films were formed following the samc procedurcs as in Example 42 except that $NH_3$, NOF, $NO_2$ and $N_2O$ were used in place $N_2$.

The obtained nitrogen containing amorphous deposited films had excellent electrical characteristics and were well doped.

EXAMPLE 50

A drum shaped electrophotographic image-forming member having a layer structure as shown in FIG. 1 was prepared using the apparatus as shown in FIG. 4.

The apparatus shown in FIG. 4 has a film forming chamber 201, solid Ge particles 204, a source inlet pipe 205 for the active species (A). an active species (A) inlet pipe 206, a motor 207, a heater 208 used in the same manner as the heater 104 in FIG. 3, blow nozzles 209 and 210, an Al cylindrical substrate 211, and an evacuation valve 212. Gas sources 213 to 216 are similar to the gas sources 106 to 109, and are connected to a gas inlet pipe 217-1 through corresponding branched pipes 213a to 216a, flowmeters 213b to 216b. pressure gauges 213c to 216c, and gas flow regulation valves 213d to 216d and 213e to 216e.

The Al cylindrical substrate 211 is suspended in the chamber 201. The heater 208 is arranged in the substrate 211.

The solid Ge particles 204 were placed in the chamber 211.

The solid Ge particles 204 were placed in the chamber (A) 202 and red heated (about 1,100° C.) by the electric furnace 203. $GeF_4$ was blown from a bomb (not shown ) through the inlet pipe 205. $GeF_2^*$ as an active species (A) was produced and was then supplied to the chamber 201 through the inlet pipe 206.

$Si_2H_6$ and $N_2$ gases were supplied to an activation chamber (B) 219 from the inlet pipe 217-1, and were activated (converted into plasmas) by a microwave plasma generator 220 into hydrogenated silicon active species and activated nitrogen, which were supplied to the film forming chamber 201 through an inlet pipe 217-2. If required, an impurity atom containing gas such as $PH_3$ or $B_2H_6$ is also supplied to the chamber (B) 219 and activated. The internal pressure of the chamber 201 was kept at 1.0 Torr.

The Al cylindrical substrate 211 was rotated. The gas was then exhausted through the evacuation valve 212, thereby forming a photosensitive layer 13.

Prior to formation of the photosensitive layer 13, an intermediate layer 12 having a thickness of 2,000 Å was formed by supplying a gas mixture consisting of $Si_2H_6$, $N_2$, $H_2$, and $B_2H_6$ (the volume content of $B_2H_6$ was 0.2% by volume) in addition to the gas used for forming the photosensitive layer 13 through the inlet pipe 217-1.

COMPARATIVE EXAMPLE 6

An electrophotographic image forming members having a layer structure as shown in FIG. 1 were prepared by the conventional plasma CVD method using $GeF_4$, $Si_2H_6$, $N_2$, $H_2$ and $B_2H_6$ gases, a film forming chamber as the film forming chamber 201 and an high frequency generator of 13.56 MHz.

The preparing conditions and performance of the drum shaped electrophotographic image forming member obtained in Example 50 and Comparative Example 6 are shown in Table 2F.

EXAMPLE 51

A PIN diode like that shown in FIG. 2 was prepared, using $N_2$ as the nitrogen containing compound, with the apparatus shown in FIG. 3.

A polyethylene naphthalate film 21 having 1,000 Å thick ITO film 22 vapor deposited thereon was placed on the support 102, and the chamber interior was evacuated to a pressure of $10^{-6}$ Torr. The active species $GeF_2^*$ produced in the same manner as in Example 42 was introduced into the film forming chamber 101. $Si_3H_6$ and $PH_3$ gases(diluted to 1,000 ppm with hydrogen gas) were introduced into the activation chamber (B) 123 and were activated. The activated gases were introduced into the chamber 101 through the gas inlet pipe 124. While the pressure in the chamber 101 was kept at 0.4 Torr, an n-type A—SiGe (H, X) film 24 (700 Å thickness) doped with P was formed.

An undoped A—SiGe (H, X) film 25 (5000 Å thickness) was formed by the same method as in the case of the n-type A—SiGe (H, X) film, except that supply of the $PH_3$ gas was stopped.

A p-type nitrogen containing A—SiGe (H, X) film 26 (700 Å thickness) doped with B was formed under the same conditions as the n-type film, except that $N_2$ and $B_2H_6$ gases (diluted to 1,000 ppm with hydrogen gas) were used together with $Si_3H_6$ gas. An Al electrode 27 having a thickness of 1,000 Å was formed on the p-type A—SiGe (H, X) film by vacuum deposition to obtain a PIN diode.

The I-V characteristics of the obtained diode element (1 $cm^2$ area) were measured, and the rectification and photovoltaic characteristics were evaluated. The obtained results are shown in Table 3F. When the light irradiation characteristics of the diode were examined by irradiating the diode with light from the substrate side at a light emission intensity AMI of about 100 $mW/cm^2$, a conversion efficiency of 8.4% or more, an open circuit voltage of 0.9 V and a short-circuit current of 10.2 $mA/cm2$ were obtained

EXAMPLES 52 to 54

PIN diodes as in Example 51 were prepared following the same procedures therein, except that NO, $N_2O$ and $N_2O_4$ were used in place of $N_2$ as the nitrogen containing compound. The rectification and photovoltaic characteristics of the diodes were evaluated, and the obtained results are shown in Table 3F.

TABLE 1A

|  | Example 1 | Example 2 |
|---|---|---|
| Gas for producing active species (B) | $H_2$ | $H_2/F_2$ |
| $\sigma d$ (nondoped) $(\Omega \cdot cm)^{-1}$ | $9.0 \times 10^{-8}$ | $7.5 \times 10^{-8}$ |
| $\sigma d$ (B-doped) $(\Omega \cdot cm)^{-1}$ | $7.3 \times 10^{-6}$ | $3.1 \times 10^{-6}$ |
| $\sigma d$ (P-doped) $(\Omega \cdot cm)^{-1}$ | $6.9 \times 10^{-5}$ | $6.2 \times 10^{-5}$ |

TABLE 2A

|  | Example 3 | Comparative Example 1 |
|---|---|---|
| Gas for producing active species (A) | $GeF_4/SiF_4$ |  |
| Activation temperature | 1100° C. |  |
| Main active species | $GeF_2^*/SiF_2^*$ |  |
| Gas for producing active species (B) | $H_2$ |  |
| Gas amount from activation chamber (A) | 200 SCCM |  |
| Gas amount from activation chamber (B) | 100 SCCM |  |
| Gas amount from gas bomb |  | $GeF_4$ 100 SCCM $SiF_4$ 200 SCCM $H_2$ 100 SCCM |
| Internal pressure of film forming chamber | 0.8 Torr | 1.0 Torr |
| Film forming rate | 12 Å/sec | 5 Å/sec |
| RF discharge power |  | 1.8 w/$cm^2$ |
| Thickness of photosensitive layer 13 | 22μ | 22μ |
| Average number of image defects in 10 drum-shaped electrophotographic imaging members | 4 | 20 |
| Circumferential fluctuation of acceptance potential | ±13 V | ±35 V |
| Axial fluctuation of acceptance potential | ±17 V | ±40 V |
| Remarks | Example using process of this invention | Example using conventional plasma CVD Substrate tem- |

TABLE 2A-continued

|  | Example 3 | Comparative Example 1 |
|---|---|---|
|  | perature: 250° C. |  |

TABLE 3A

|  | Example 4 | Example 5 |
|---|---|---|
| Gas for film formation | $H_2$ | $H_2/F_2$ |
| Rectification ratio of diode (*1) | $4.0 \times 10^2$ | $5.0 \times 10^2$ |
| n value of diode (*2) | 1.2 | 1.2 |

TABLE 1B-continued

|  | Example 6 | Example 7 | Example 8 | Example 9 |
|---|---|---|---|---|
| $(\Omega \cdot cm)^{-1}$ |  |  |  |  |
| $\sigma d$ (P-doped) $(\Omega \cdot cm)^{-1}$ | $4.3 \times 10^{-7}$ | $2.8 \times 10^{-7}$ | $8.5 \times 10^{-7}$ | $7.5 \times 10^{-7}$ |

TABLE 2B

|  | Example 10 | Comparative Example 2 |
|---|---|---|
| Gas for producing active species (A) | $GeF_4$ |  |
| Activation temperature | 1100° C. |  |
| Main active species | $GeF_2^*$ |  |
| Gas for producing active species (B) | $Si_2H_6/H_2$ |  |
| Gas amount from activation chamber (A) | 200 SCCM |  |
| Gas amount from activation chamber (B) | 100 SCCM |  |
| Gas amount from gas bomb |  | $GeF_4$ 200 SCCM $Si_2H_6$ 100 SCCM $H_2$ 100 SCCM |
| Internal pressure of film forming chamber |  | 1.0 Torr |
| Film forming rate | 10 Å/sec | 5 Å/sec |
| RF discharge power |  | 1.8 W/cm² |
| Thickness of photosensitive layer 13 | 22μ | 22μ |
| Average number of image defects in 10 drum-shaped electrophotographic imaging members | 2 | 16 |
| Circumferential fluctuation of acceptance potential | ±12 V | ±30 V |
| Axial fluctuation of acceptance potential | ±15 V | ±36 V |
| Remarks | Example using process of this invention | Example using conventional plasma CVD Substrate temperature ... 250° C. |

(*1) Ratio of forward current to reverse current at voltage of 1 V
(*2) n value (Quality Factor) in current equation $$J = J_s \left\{ \exp\left(\frac{eV}{nRT}\right) - 1 \right\} \text{ at } p - n \text{ junction}$$

TABLE 1B

|  | Example 6 | Example 7 | Example 8 | Example 9 |
|---|---|---|---|---|
| Silicon containing compound | $Si_5H_{10}$ | $Si_4H_{10}$ | $SiH_3SiH-(SiH_3)SiH_3$ | $H_6Si_6F_6$ |
| $\sigma d$ (undoped) $(\Omega \cdot cm)^{-1}$ | $7.7 \times 10^{-9}$ | $4.0 \times 10^{-9}$ | $5.5 \times 10^{-9}$ | $3 \times 10^{-9}$ |
| $\sigma d$ (B-doped) | $7.3 \times 10^{-8}$ | $3.5 \times 10^{-8}$ | $4.0 \times 10^{-8}$ | $4.1 \times 10^{-8}$ |

TABLE 3B

|  | Example 11 | Example 12 | Example 13 | Example 14 |
|---|---|---|---|---|
| Gas for film formation | $Si_3H_6$ | $Si_4H_{10}$ | $SiH_3SiH-(SiH_3)SiH_3$ | $H_6Si_6F_6$ |
| Rectification ratio of diode (*1) | $7 \times 10^2$ | $6.5 \times 10^2$ | $8 \times 10^2$ | $8.5 \times 10^2$ |
| n value of diode (*2) | 1.1 | 1.4 | 1.3 | 1.25 |

(*1) Ratio of forward current to reverse current at voltage of 1 V
(*2) n value (Quality Factor) in current equation $$J = J_s \left\{ \exp\left(\frac{eV}{nRT}\right) - 1 \right\} \text{ at } p - n \text{ junction}$$

TABLE 1C

|  | Example 15 | Example 16 | Example 17 | Example 18 |
|---|---|---|---|---|
| Carbon-containing compound | $CH_4$ | $C_2H_6$ | $C_2H_4$ | $C_2H_2$ |
| $\sigma d$ (non-doped) $(\Omega \cdot cm)^{-1}$ | $7.8 \times 10^{-10}$ | $4.1 \times 10^{-10}$ | $5.1 \times 10^{-10}$ | $4.7 \times 10^{-10}$ |
| $\sigma d$ (B-doped) $(\Omega \cdot cm)^{-1}$ | $7.2 \times 10^{-8}$ | $2.6 \times 10^{-8}$ | $4.3 \times 10^{-8}$ | $3.5 \times 10^{-8}$ |
| $\sigma d$ (B-doped) $(\Omega \cdot cm)^{-1}$ | $5.0 \times 10^{-6}$ | $4.8 \times 10^{-6}$ | $5.2 \times 10^{-6}$ | $5.9 \times 10^{-6}$ |

TABLE 2C

|  | Example 19 | Comparative Example 3 |
|---|---|---|
| Gas for producing active species (A) | $GeF_4$ |  |

TABLE 2C-continued

|  | Example 19 | Comparative Example 3 |
|---|---|---|
| Activation temperature | 1100° C. |  |
| Main active species | GeF$_2$* |  |
| Gas for producing active species (B) | CH$_4$/Si$_2$H$_6$/H$_2$ (volume ratio 0.1:2:0.1) |  |
| Gas amount from activation chamber (A) | 200 SCCM |  |
| Gas amount from activation chamber (B) | 100 SCCM |  |
| Gas amount from gas bomb |  | GeF$_4$ 200 SCCM<br>CH$_4$ 50 SCCM<br>SiH$_4$ 100 SCCM<br>H$_2$ 100 SCCM |
| Internal pressure of film forming chamber | 1.0 Torr | 1.0 Torr |
| Film forming rate | 9 Å/sec | 5 Å/sec |
| RF discharge power |  | 1.8 w/cm$^2$ |
| Thickness of photosensitive layer 13 | 23μ | 23μ |
| Average number of image defects in 10 drum-shaped electrophotographic imaging members | 3 | 16 |
| Circumferential fluctuation of acceptance potential | ±8 V | ±30 V |
| Axial fluctuation of acceptance potential | ±16 V | ±35 V |
| Remarks | Example of process of this invention | Example using conventional plasma CVD substrate temperature ... 250° C. |

TABLE 3C

|  | Example 20 | Example 21 | Example 22 | Example 23 |
|---|---|---|---|---|
| Gas producing active species (B) | CH$_4$ | C$_2$H$_6$ | C$_2$H$_4$ | C$_2$H$_2$ |
| Rectification ratio of diode (*1) | 4 × 10$^2$ | 7 × 10$^2$ | 6 × 10$^2$ | 5 × 10$^2$ |
| n value of diode (*2) | 1.4 | 1.3 | 1.2 | 1.3 |

(*1) Ratio of forward current to reverse current at voltage of 1 V
(*2) n value (Quality Factor) in current equation $$J = Js\left\{\exp\left(\frac{eV}{nRT}\right) - 1\right\} \text{ at p} - \text{n junction}$$

TABLE 1D

|  | Example 24 | Example 25 | Example 26 | Example 27 |
|---|---|---|---|---|
| Ge compound | GeH$_4$ | Straight chain Ge$_4$H$_{10}$ | Branched Ge$_4$H$_{10}$ | H$_6$Ge$_6$F$_6$ |
| σd (non-doped) (Ω · cm)$^{-1}$ | 8 × 10$^{-4}$ | 7.4 × 10$^{-4}$ | 7.9 × 10$^{-4}$ | 5.8 × 10$^{-4}$ |
| σd (B-doped) (Ω · cm)$^{-1}$ | 6.3 × 10$^{-3}$ | 3.2 × 10$^{-3}$ | 3.2 × 10$^{-3}$ | 6.3 × 10$^{-3}$ |
| σd (P-doped) (Ω · cm)$^{-1}$ | 6.5 × 10$^{-2}$ | 4.0 × 10$^{-2}$ | 3.5 × 10$^{-2}$ | 7 × 10$^{-2}$ |

TABLE 2D

|  | Example 28 | Comparative Example 4 |
|---|---|---|
| Gas for producing active species (A) | GeF$_4$ |  |
| Activation temperature | 1100° C. |  |
| Main active species | GeF$_2$* |  |
| Gas for producing active species (B) | Si$_2$H$_6$/GeH$_4$/H$_2$ |  |
| Gas amount from activation chamber (A) | 200 SCCM |  |
| Gas amount from activation chamber (B) | 100 SCCM |  |
| Gas amount from gas bomb |  | GeF$_4$ 200 SCCM<br>Si$_2$H$_6$ 100 SCCM<br>GeH$_4$ 50 SCCM<br>H$_2$ 100 SCCM |
| Internal pressure of film forming chamber | 1.0 Torr | 1.0 Torr |
| Film forming rate | 11 Å/sec | 5 Å/sec |
| RF discharge power |  | 1.8 w/cm$^2$ |
| Thickness of photosensitive layer 13 | 22 μm | 22 μm |
| Average number of image defects in 10 drum-shaped electrophotographic imaging member | 3 | 22 |
| Circumferential fluctuation of acceptance potential | ±12 V | ±33 V |
| Axial fluctuation of acceptance potential | ±15 V | ±38 V |
| Remarks | Example using process of this invention | Example using conventional plasma CVD Substrate temperature ... 250° C. |

TABLE 3D

|  | Example 29 | Example 30 | Example 31 | Example 32 |
|---|---|---|---|---|
| Gas for producing active species (B) | $GeH_4$ | Straight chain $Ge_4H_{10}$ | Branched $Ge_4H_{10}$ | $H_6Ge_6F_6$ |
| Rectification ratio of diode (*1) | $7.1 \times 10^2$ | $7.2 \times 10^2$ | $7.0 \times 10^2$ | $7.8 \times 10^2$ |
| n value of diode (*2) | 1.3 | 1.3 | 1.42 | 1.29 |

(*1) Ratio of forward current to reverse current at voltage of 1 V
(*2) n value (Quality Factor) in current equation $$J = J_s \left\{ \exp\left(\frac{eV}{nRT}\right) - 1 \right\} \text{ at } p-n \text{ junction}$$

TABLE 1E

|  | Example 33 | Example 34 | Example 35 | Example 36 |
|---|---|---|---|---|
| Gas for producing active species (B) | $O_2$/He | $O_2$/He/$Si_2F_6$ | $O_2$/He/$Ge_2H_6$ | $O_2$/He/$C_2H_6$ |
| $\sigma d$ (non-doped) $(\Omega \cdot cm)^{-1}$ | $3.2 \times 10^{-8}$ | $2.5 \times 10^{-10}$ | $4.8 \times 10^{-9}$ | $7.3 \times 10^{-11}$ |
| $\sigma d$ (B-doped) $(\Omega \cdot cm)^{-1}$ | $7.5 \times 10^{-7}$ | $6.8 \times 10^{-9}$ | $8.5 \times 10^{-8}$ | $6.8 \times 10^{-10}$ |
| $\sigma d$ (P-doped) $(\Omega \cdot cm)^{-1}$ | $3.8 \times 10^{-7}$ | $4.5 \times 10^{-8}$ | $7.5 \times 10^{-7}$ | $3.8 \times 10^{-9}$ |

TABLE 2E

|  | Example 41 | Comparative Example 5 |
|---|---|---|
| Gas for producing active species (A) | $GeF_4$ |  |
| Activation temperature | 1100° C. |  |
| Main active species | $GeF_2$ |  |
| Gas for producing active species (B) | $Si_2F_6$/$O_2$/He |  |
| Gas amount from activation chamber (A) | 200 SCCM |  |
| Gas amount from activation chamber (B) | 100 SCCM |  |
| Gas amount from gas bomb |  | $GeF_4$ 200 SCCM $Si_2F_6$ 100 SCCM $O_2$($Si_2H_6$: $O_2$ = 1:$10^5$) He 100 SCCM |
| Internal pressure of film forming chamber | 1.0 Torr | 1.0 Torr |
| Film forming rate | 11 Å/sec | 6 Å/sec |

|  | Example 37 | Comparative Example 5 |
|---|---|---|
| RF discharge power |  | 1.8 w/cm² |
| Thickness of photosensitive layer 13 | 23μ | 23μ |
| Average number of image defects in 10 drum-shaped electrophotographic imaging members | 3 | 14 |
| Circumferential fluctuation of acceptance potential | ±11 V | ±30 V |
| Axial fluctuation of acceptance potential | ±16 V | ±35 V |
| Remarks | Example using process of this invention | Example using conventional plasma CVD Substrate temperature ... 250° C. |

TABLE 3E

|  | Example 38 | Example 39 | Example 40 | Example 41 |
|---|---|---|---|---|
| Gas for producing active species (B) | $O_2$ | $H_2SiOSiH_3$ | $H_3GeOGeH_3$ | $COhd 2$ |
| Rectification ratio of diode (*1) | $5 \times 10^2$ | $6 \times 10^2$ | $7 \times 10^2$ | $4 \times 10^2$ |
| n value of diode (*2) | 1.3 | 1.4 | 1.4 | 1.3 |

(*1) Ratio of forward current to reverse current at voltage of 1 V
(*2) n value (Quality Factor) in current equation $$J = J_s \left\{ \exp\left(\frac{eV}{nRT}\right) - 1 \right\} \text{ at } p-n \text{ junction}$$

TABLE 1F

|  | Example 42 | Example 43 | Example 44 | Example 45 |
|---|---|---|---|---|
| Gas for producing active species (B) | $N_2$ | $N_2$/$Si_2F_6$ | $N_2$/$Ge_2H_6$ | $N_2$/$C_2H_6$ |
| $\sigma d$ (non-doped) $(\Omega \cdot cm)^{-1}$ | $4.5 \times 10^{-9}$ | $7.8 \times 10^{-8}$ | $4.1 \times 10^{-7}$ | $6.3 \times 10^{-10}$ |
| $\sigma d$ (B-doped) $(\Omega \cdot cm)^{-1}$ | $9.5 \times 10^{-8}$ | $4.8 \times 10^{-7}$ | $2.8 \times 10^{-6}$ | $7.3 \times 10^{-6}$ |
| $\sigma d$ (P-doped) $(\Omega \cdot cm)^{-1}$ | $7 \times 10^{-8}$ | $5.0 \times 10^{-6}$ | $1.1 \times 10^{-5}$ | $6 \times 10^{-8}$ |

TABLE 2F

|  | Example 50 | Comparative Example 6 |
|---|---|---|
| Gas for producing active species (A) | $GeF_4$ |  |

TABLE 2F-continued

|  | Example 50 | Comparative Example 6 |
|---|---|---|
| Activation temperature | 1100° C. |  |
| Main active species | GeF$_2$ |  |
| Gas for producing active species (B) | Si$_2$H$_6$/N$_2$H$_2$ |  |
| Gas amount from activation chamber (A) | 200 SCCM |  |
| Gas amount from activation chamber (B) | 98 SCCM |  |
| Gas amount from gas bomb |  | GeF$_2$ 200 SCCM Si$_2$H$_6$ 100 SCCM N$_2$ 50 SCCM H$_2$ 100 SCCM |
| Internal pressure of film forming chamber | 1.0 Torr | 1.0 Torr |
| Film forming rate | 11 Å/sec | 5 Å/sec |
| RF discharge power |  | 1.9 w/cm$^2$ |
| Thickness of photosensitive layer 13 | 22 μm | 22 μm |
| Average number of image defects in 10 drum-shaped electrophotographic imaging members | 2 | 20 |
| Circumferential fluctuation of acceptance potential | ±10 V | ±30 V |
| Axial fluctuation of acceptance potential | ±15 V | ±36 V |
| Remarks | Example using process of this invention | Example using conventional plasma CVD Substrate temperature ... 260° C. |

TABLE 3F

|  | Example 51 | Example 52 | Example 53 | Example 54 |
|---|---|---|---|---|
| Gas for producing active species (B) | N$_2$ | NO | N$_2$O | N$_2$O$_4$ |
| Rectification ratio of diode (*1) | 4.1 × 10$^2$ | 4.2 × 10$^2$ | 5.6 × 10$^2$ | 8.0 × 10$^2$ |
| n value of diode (*2) | 1.2 | 1.3 | 1.4 | 1.1 |

(*1) Ratio of forward current to reverse current at voltage of 1 V
(*2) n value (Quality Factor) in current equation $$J = J_s \left\{ \exp\left(\frac{eV}{nRT}\right) - 1 \right\} \text{ at p } - \text{ n junction}$$

What is claimed is:

1. A process for forming a deposited film, which comprises introducing into a film forming space housing a substrate therein an active species (A) formed by decomposition of a compound containing germanium and a halogen and an active species (B) formed by decomposition of a chemical substance for film formation which is reactive with said active species (A) separately from each other, and then allowing both the species to react with each other thereby to form a deposited film on the substrate.

2. A process according to claim 1, wherein said active species (B) is formed from hydrogen and/or a halogen compound.

3. A process according to claim 1, wherein said active species (B) is formed from a silicon containing compound.

4. A process according to claim 1, wherein said active species (B) is formed from a carbon containing compound.

5. A process according to claim 1, wherein said active species (B) is formed form a germanium containing compound.

6. A process according to claim 1, wherein said active species (B) is formed from an oxygen containing compound.

7. A process according to claim 1, wherein said active species (B) is formed from a nitrogen containing compound.

8. A process according to claim 1, wherein said active species (A) is formed by decomposition of a chain or cyclic hydrogenated germanium of which hydrogen atoms are partially or wholly substituted with halogen aotms.

9. A process according to claim 8, wherein said active species (B) is formed from hydrogen and/or a halogen compound.

10. A process according to claim 8, wherein said acitve species (B) is formed from a silicon containing compound 11. A process according to claim 8, wherein said acitve species (B) is formed from a carbon containing compound.

12. A process according to claim 8, wherein said active apecies (B) is formed form a germanium containing compound.

13. A process according to claim 8, wherein said active species (B) is formed from an oxygen containing compound.

14. A process according to claim 8, wherein said active species (B) is formed from a nitorgen containing compound.

15. A process according to claim 1, wherein an active species (SX) formed by decomposition of a compound containing silicon and a halogen and/or an active species (CX) formed by decomposition of a compound containing carbon and a halogen is used in addition to said active species (A).

16. A process according to claim 15, wherein said active species (B) is formed from hydrogen and/or a halogen compound.

17. A process according to claim 15, wherein said active species (B) is formed from a silicon containing compouns.

18. A process according to claim 15, wherein said active species (B) is formed from a carbon containing compound.

19. A process according to claim 15, wherein said active species (B) is formed from a germanium containing compound.

20. A process according to claim 15, wherein said active species (B) is formed from an oxygen containing compound.

21. A process according to claim 15, wherein said active species (B) is formed from a nitrogen containing compound.

* * * * *

UNITED STATES PATENT AND TRADEMARK OFFICE
CERTIFICATE OF CORRECTION

PATENT NO. : 4,716,048

DATED : December 29, 1987

INVENTOR(S) : SHUNICHI ISHIHARA, ET AL.

It is certified that error appears in the above-identified patent and that said Letters Patent is hereby corrected as shown below:

COLUMN 1

Line 24, "in various kinds of" should be deleted.

Line 25, "use environment," should read --use in various kinds of environment,--.

Lines 63-64, "Accordingly the tolerances narrower and for mass production" should read --Accordingly, the tolerances for mass production are narrower and--.

COLUMN 10

Line 11, "(8)" should read --(B)--.

COLUMN 12

Lines 29-30, "Asi(H,X,Ge,C), Asi(H,X,Ge,C), A-Si(H,X,C)," should read --A-Si(H,X), A-Si(H,X,Ge,C), A-Si(H,X,C),--.

COLUMN 19

Line 15, "220" should read --219--.

COLUMN 20

Line 19, "$Si_4H_{10}$." should read --$Si_4H_{10}$,--.

UNITED STATES PATENT AND TRADEMARK OFFICE
CERTIFICATE OF CORRECTION

PATENT NO. : 4,716,048
DATED : December 29, 1987
INVENTOR(S) : SHUNICHI ISHIHARA, ET AL.

It is certified that error appears in the above-identified patent and that said Letters Patent is hereby corrected as shown below:

COLUMN 24

Line 32, "S4" should read --4--.
Line 66, "220" should read --219--.

COLUMN 26

Line 5, "$H_6Ge6F_6$" should read --$H_6Ge_6F_6$--.

COLUMN 28

Line 59, "A-SiGeo(H,X) film 26" should read
--A-SiGe(H,X) film 26--.
Line 63, "Si F gas." should read --$Si_3F_6$ gas.--.

COLUMN 37

Table 3E, line 59, "$H_2SiOSiH_3$" should read
--$H_3SiOSiH_3$--.
Table 3E, line 59, "COhd 2" should read --$CO_2$--.

COLUMN 39

Line 59, "form" should read --from.

COLUMN 40

Line 26, "aotms." should read --atoms.--
Line 31, "acitve" should read --active--.
Line 34, "acitve" should read --active--.

UNITED STATES PATENT AND TRADEMARK OFFICE
CERTIFICATE OF CORRECTION

PATENT NO. : 4,716,048                      Page 3 of 3

DATED : December 29, 1987

INVENTOR(S) : SHUNICHI ISHIHARA, ET AL.

It is certified that error appears in the above-identified patent and that said Letters Patent is hereby corrected as shown below:

COLUMN 40 (continued)

```
Line 37, "apecies" should read --species--.
Line 37, "form" should read --from--.
Line 43, "nitorgen" should read --nitrogen--.
Line 56, "compouns." should read --compound.--.
```

Signed and Sealed this

Second Day of August, 1988

Attest:

DONALD J. QUIGG

*Attesting Officer*         *Commissioner of Patents and Trademarks*